(12) United States Patent
Noguchi et al.

(10) Patent No.: US 11,923,320 B2
(45) Date of Patent: Mar. 5, 2024

(54) SEMICONDUCTOR DEVICE HAVING TAPERED METAL COATED SIDEWALLS

(71) Applicant: Texas Instruments Incorporated, Dallas, TX (US)

(72) Inventors: Tomoko Noguchi, Oita (JP); Mutsumi Masumoto, Oita (JP); Kengo Aoya, Oita (JP); Masamitsu Matsuura, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 109 days.

(21) Appl. No.: 17/139,417

(22) Filed: Dec. 31, 2020

(65) Prior Publication Data

US 2022/0208689 A1 Jun. 30, 2022

(51) Int. Cl.
| | |
|---|---|
| H01L 21/78 | (2006.01) |
| H01L 21/56 | (2006.01) |
| H01L 21/683 | (2006.01) |
| H01L 23/00 | (2006.01) |
| H01L 23/31 | (2006.01) |
| H01L 23/498 | (2006.01) |
| H01L 23/552 | (2006.01) |

(52) U.S. Cl.
CPC .......... *H01L 23/552* (2013.01); *H01L 21/561* (2013.01); *H01L 21/6836* (2013.01); *H01L 21/78* (2013.01); *H01L 23/3114* (2013.01); *H01L 23/3135* (2013.01); *H01L 23/49816* (2013.01); *H01L 24/48* (2013.01); *H01L 2224/48245* (2013.01)

(58) Field of Classification Search
None
See application file for complete search history.

(56) References Cited

U.S. PATENT DOCUMENTS

| | | | |
|---|---|---|---|
| 6,841,419 B2 | 1/2005 | Akita | |
| 2013/0120699 A1* | 5/2013 | Ichihara | H01L 21/78 349/110 |
| 2017/0116458 A1* | 4/2017 | Liu | G06K 19/0716 |
| 2017/0287846 A1* | 10/2017 | Dias | H01L 24/94 |

* cited by examiner

*Primary Examiner* — Jay C Chang
(74) *Attorney, Agent, or Firm* — Dawn Jos; Frank D. Cimino

(57) ABSTRACT

A semiconductor device includes a semiconductor die having a top side surface comprising a semiconductor material including circuitry therein having bond pads connected to nodes in the circuitry, a bottom side surface, and sidewall surfaces between the top side surface and the bottom side surface. A metal coating layer including a bottom side metal layer is over the bottom side surface that extends continuously to a sidewall metal layer on the sidewall surfaces. The sidewall metal layer defines a sidewall plane that is at an angle from 10° to 60° relative to a normal projected from a bottom plane defined by the bottom side metal layer.

17 Claims, 22 Drawing Sheets

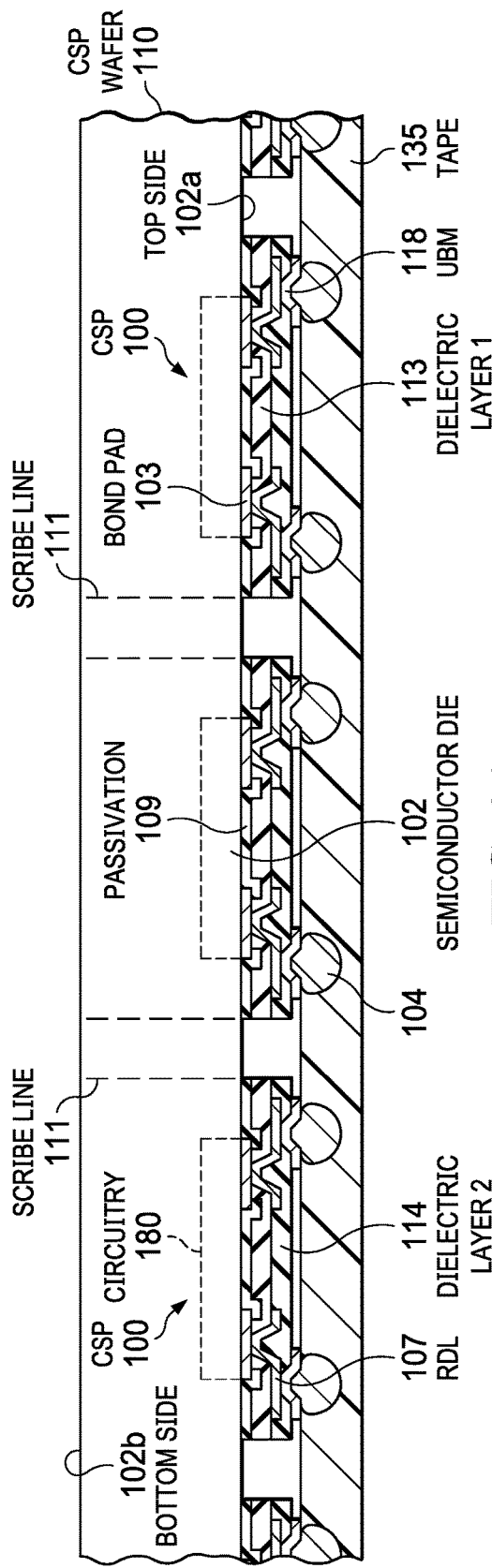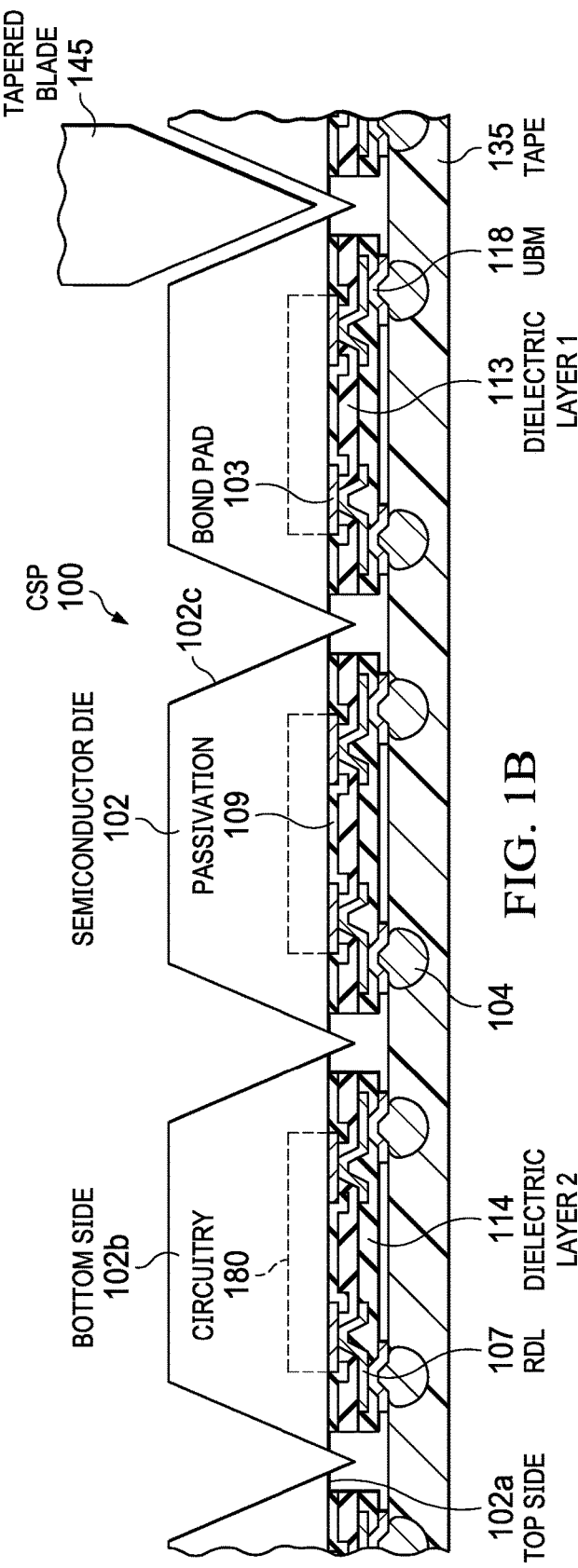

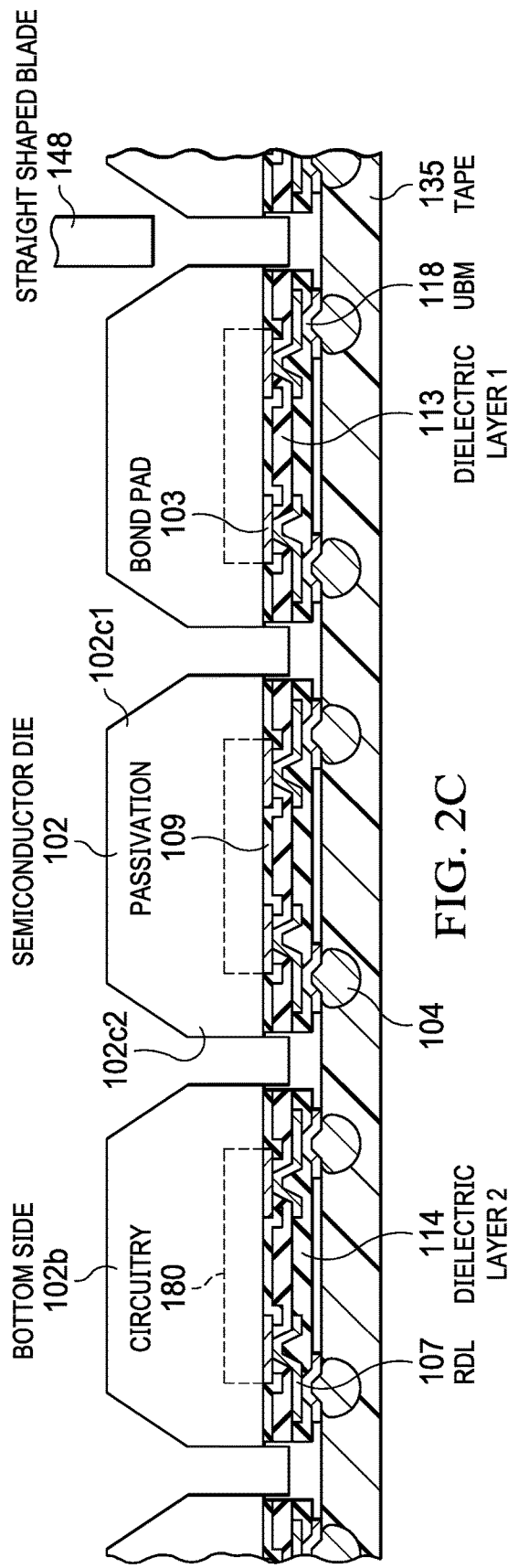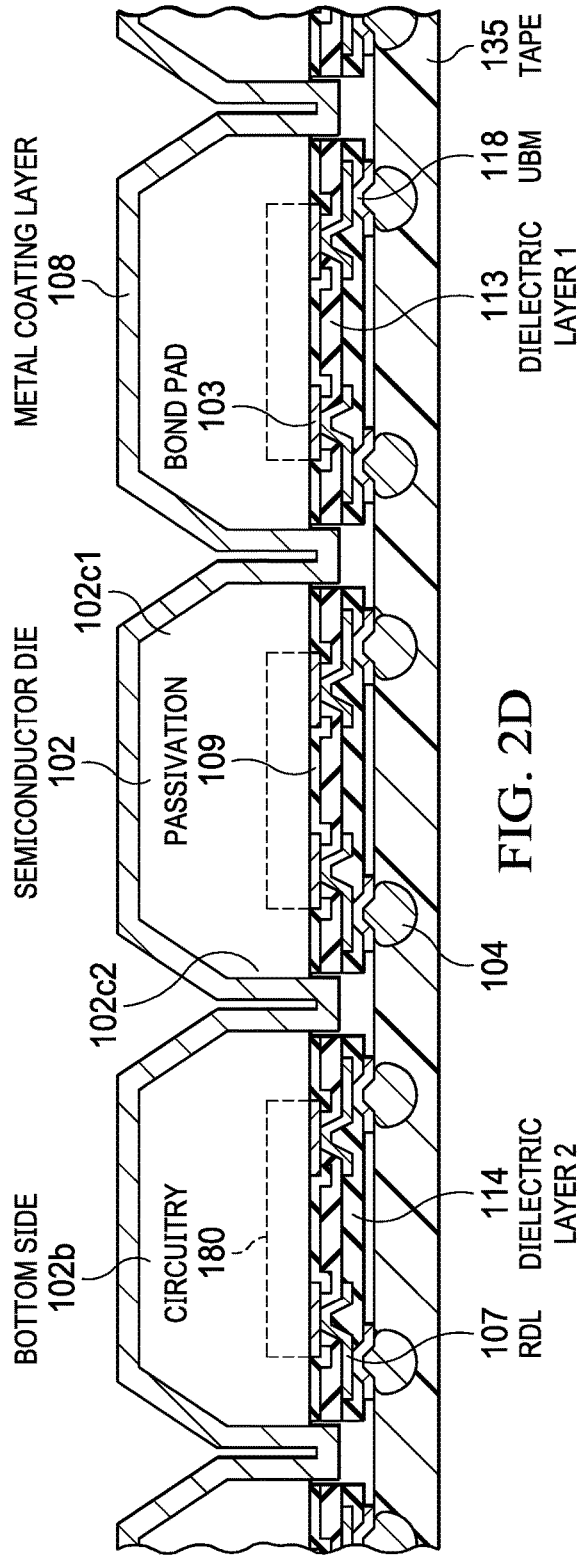

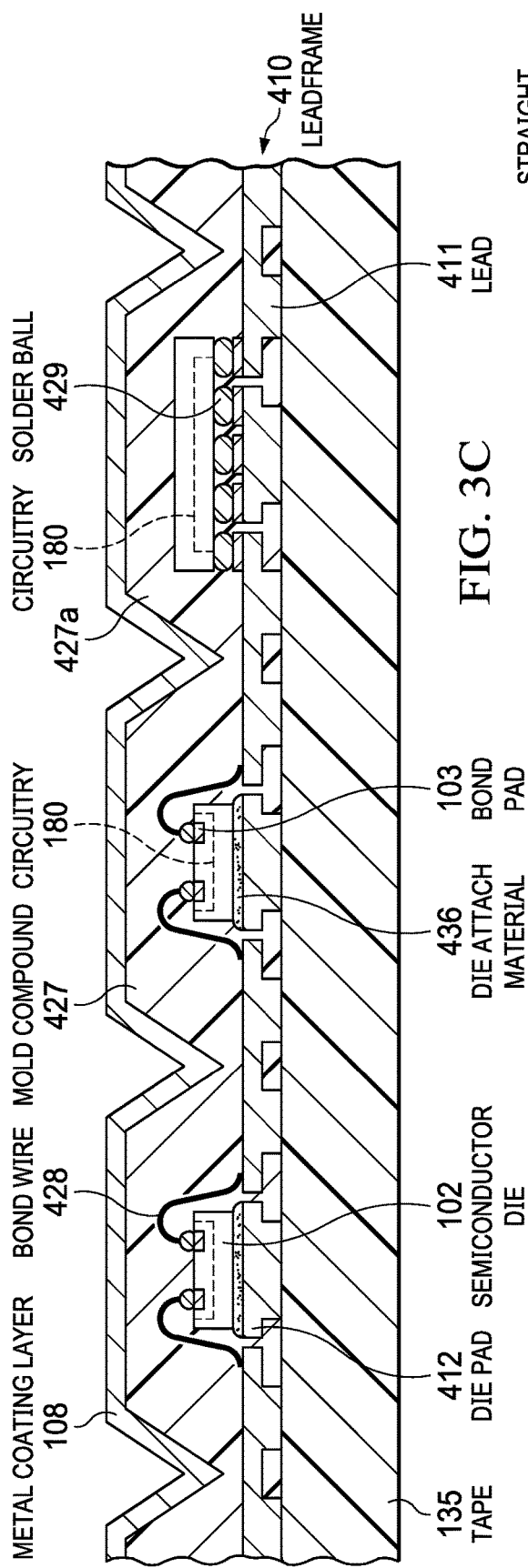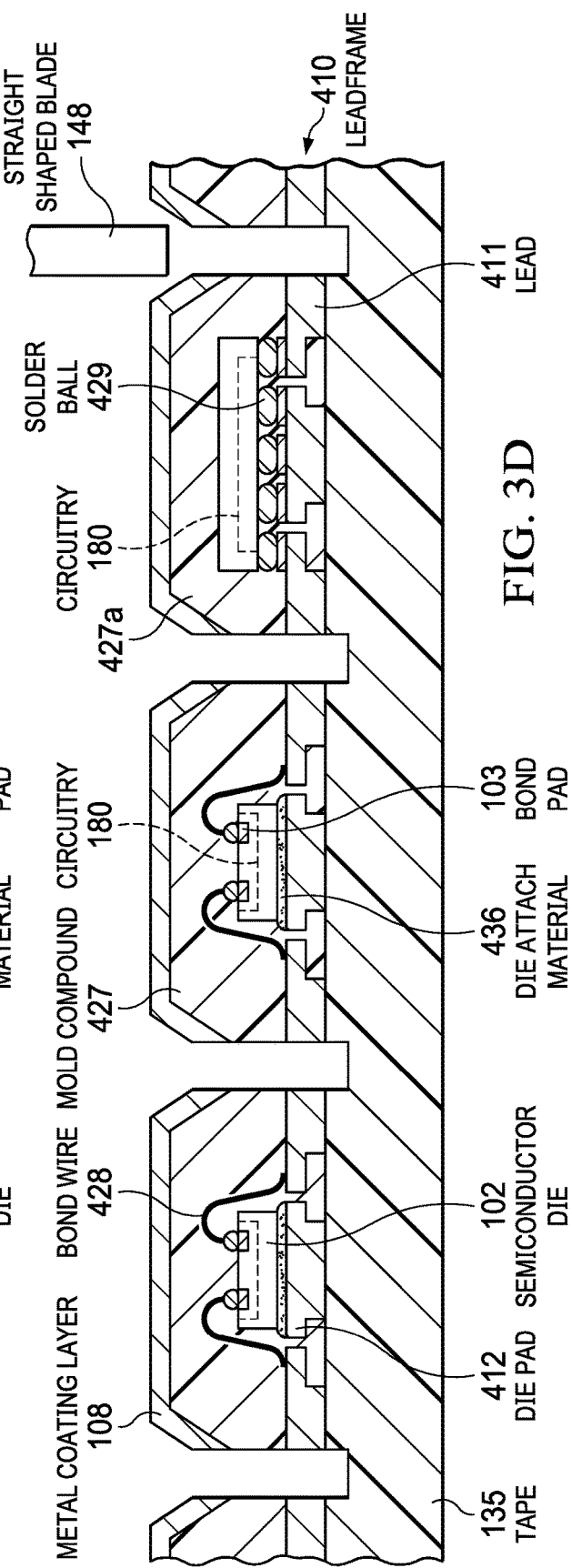

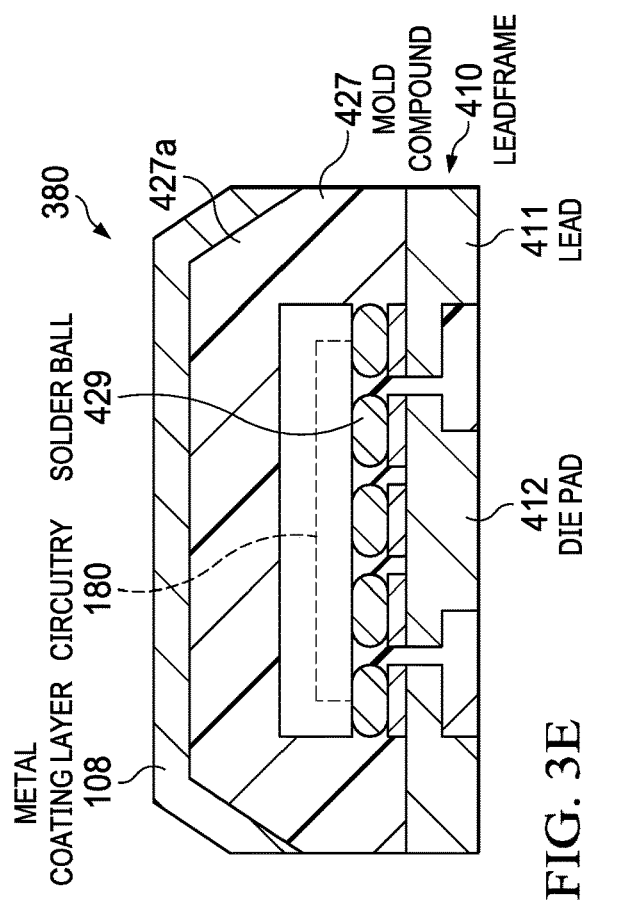
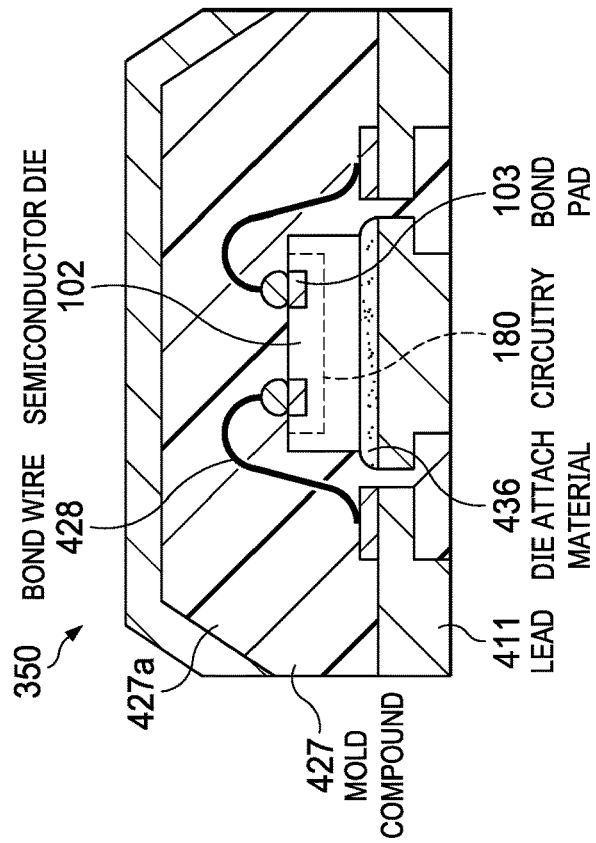

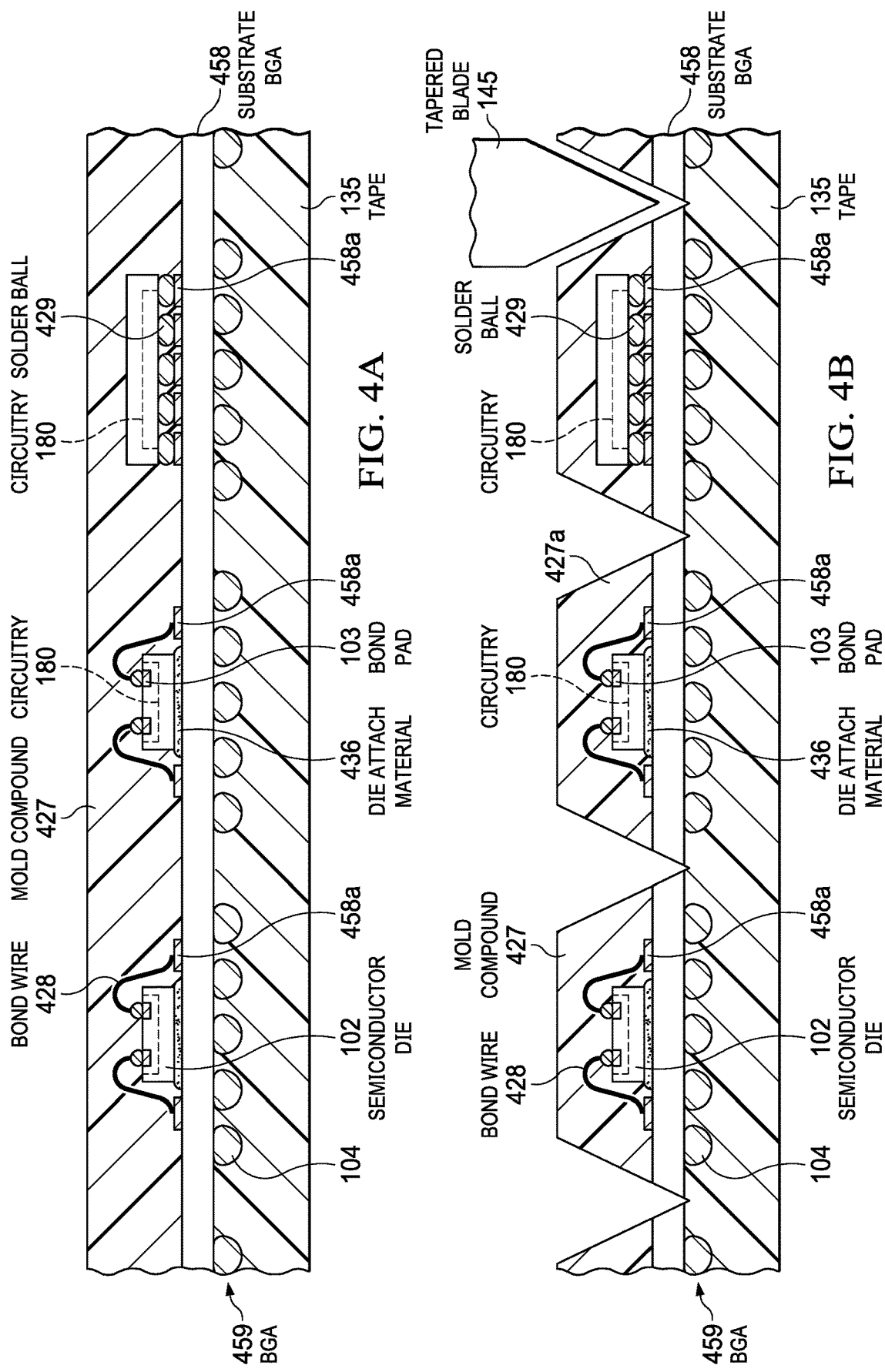

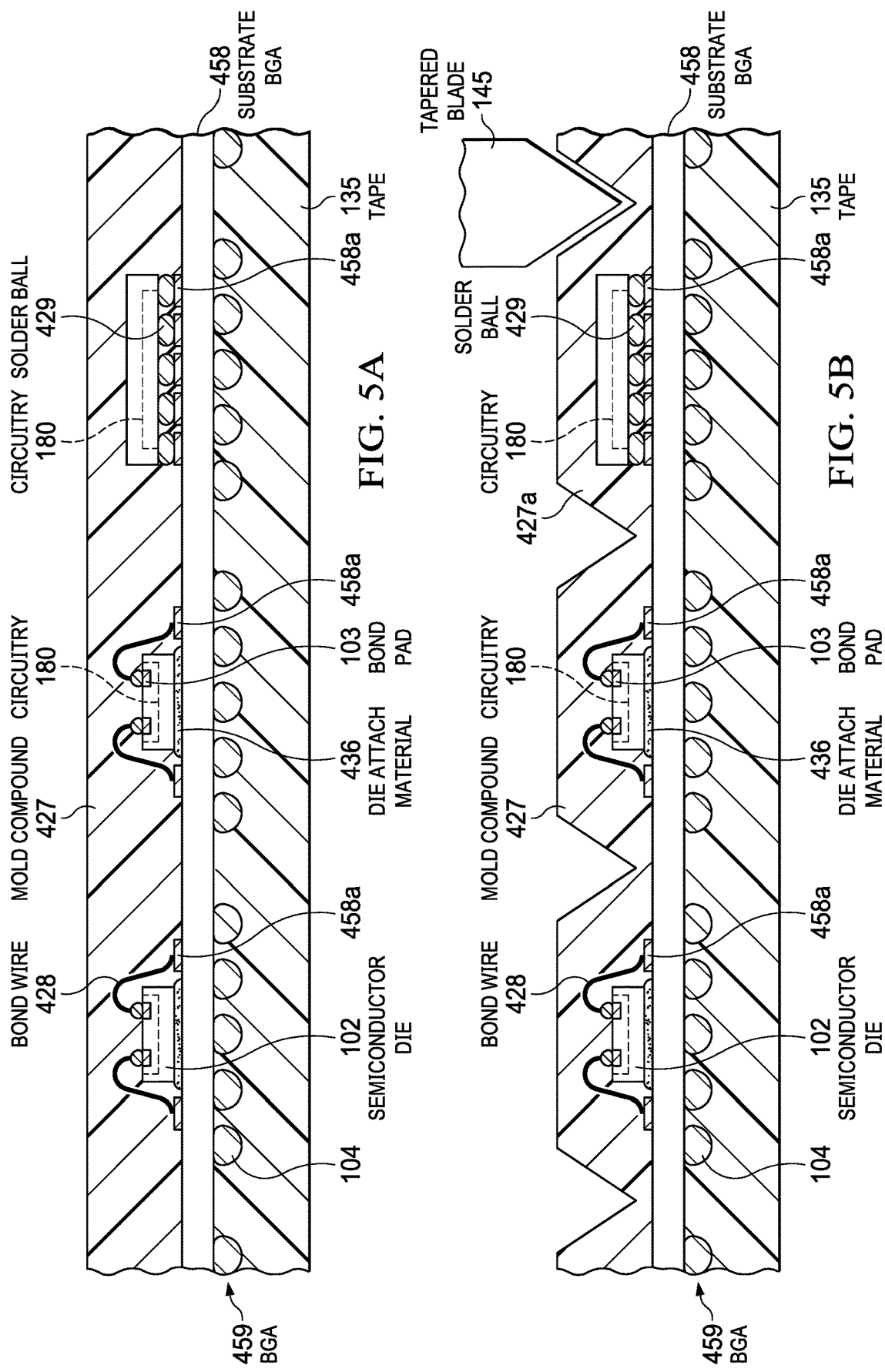

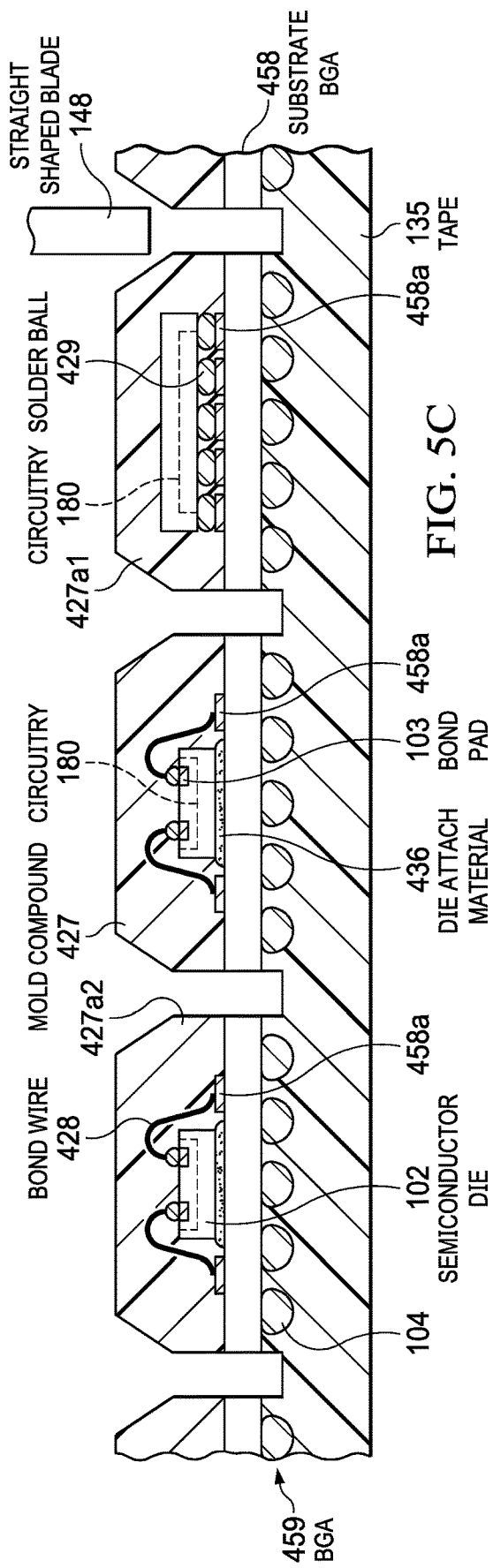
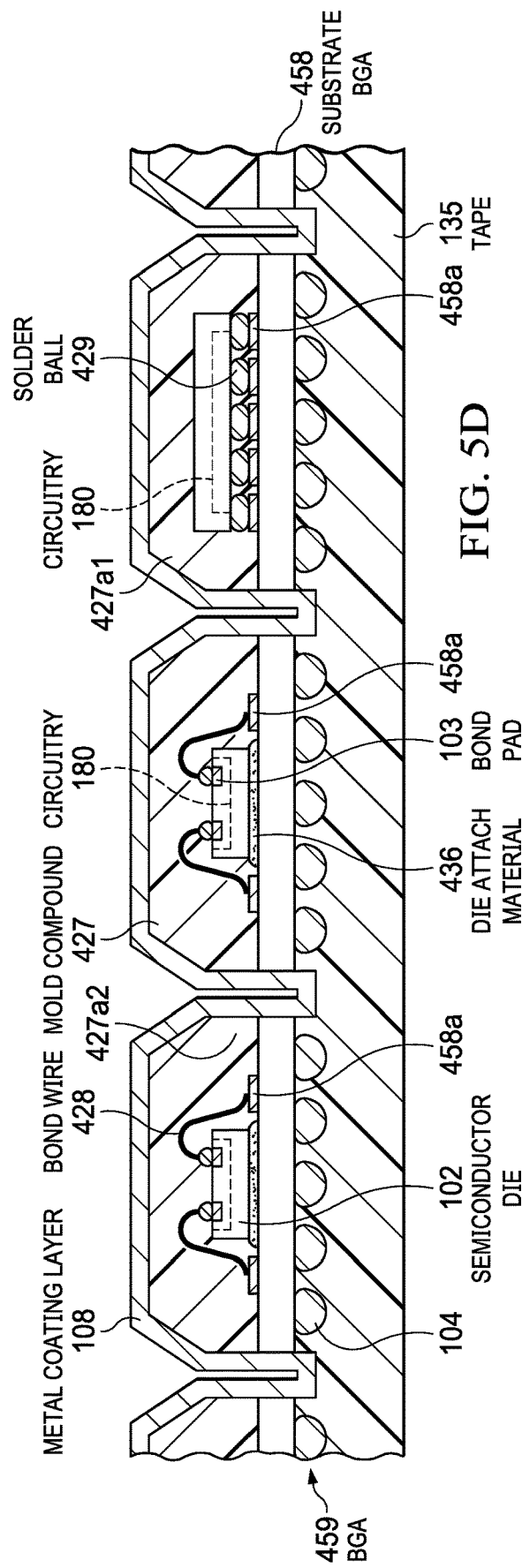

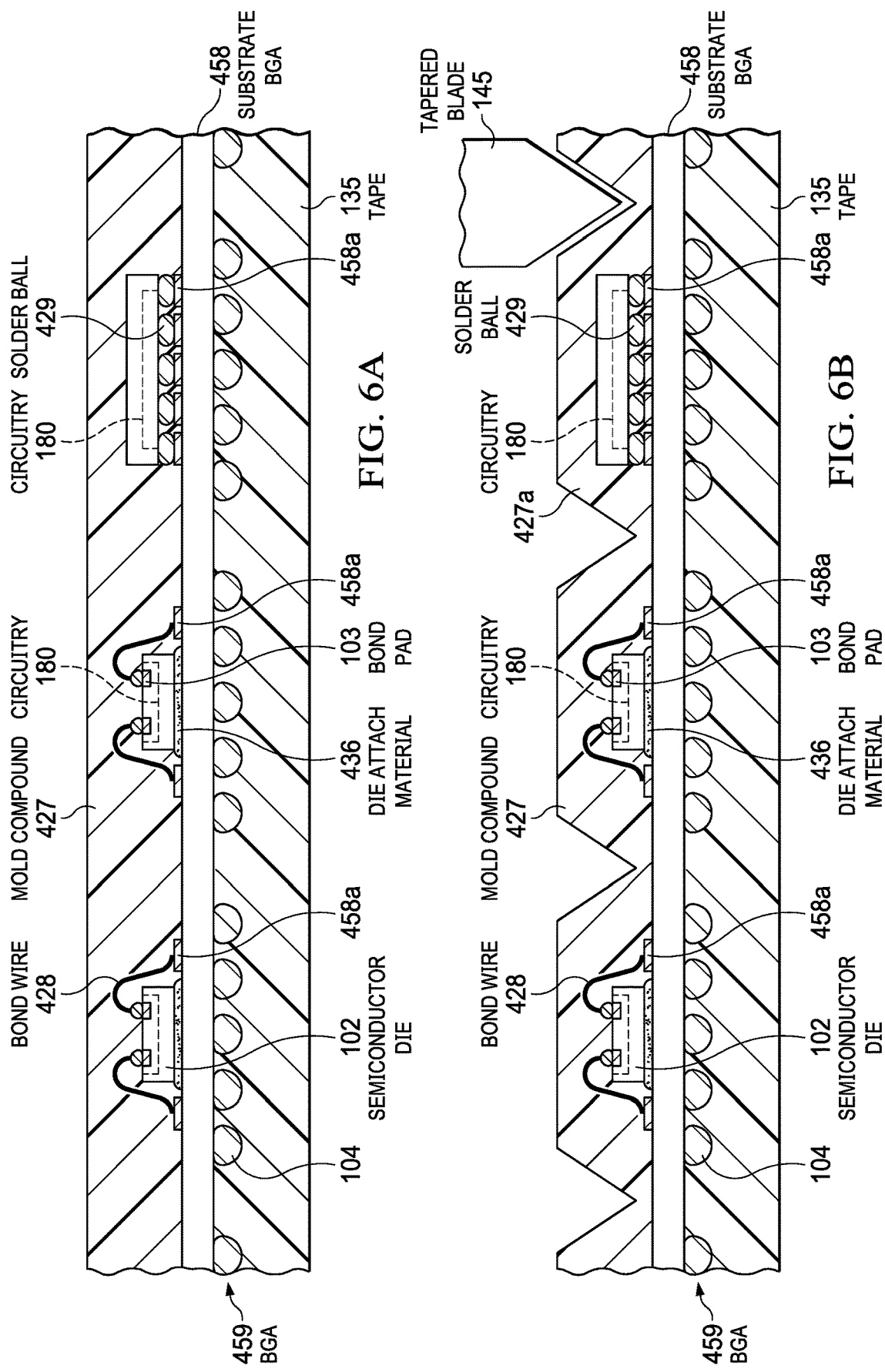

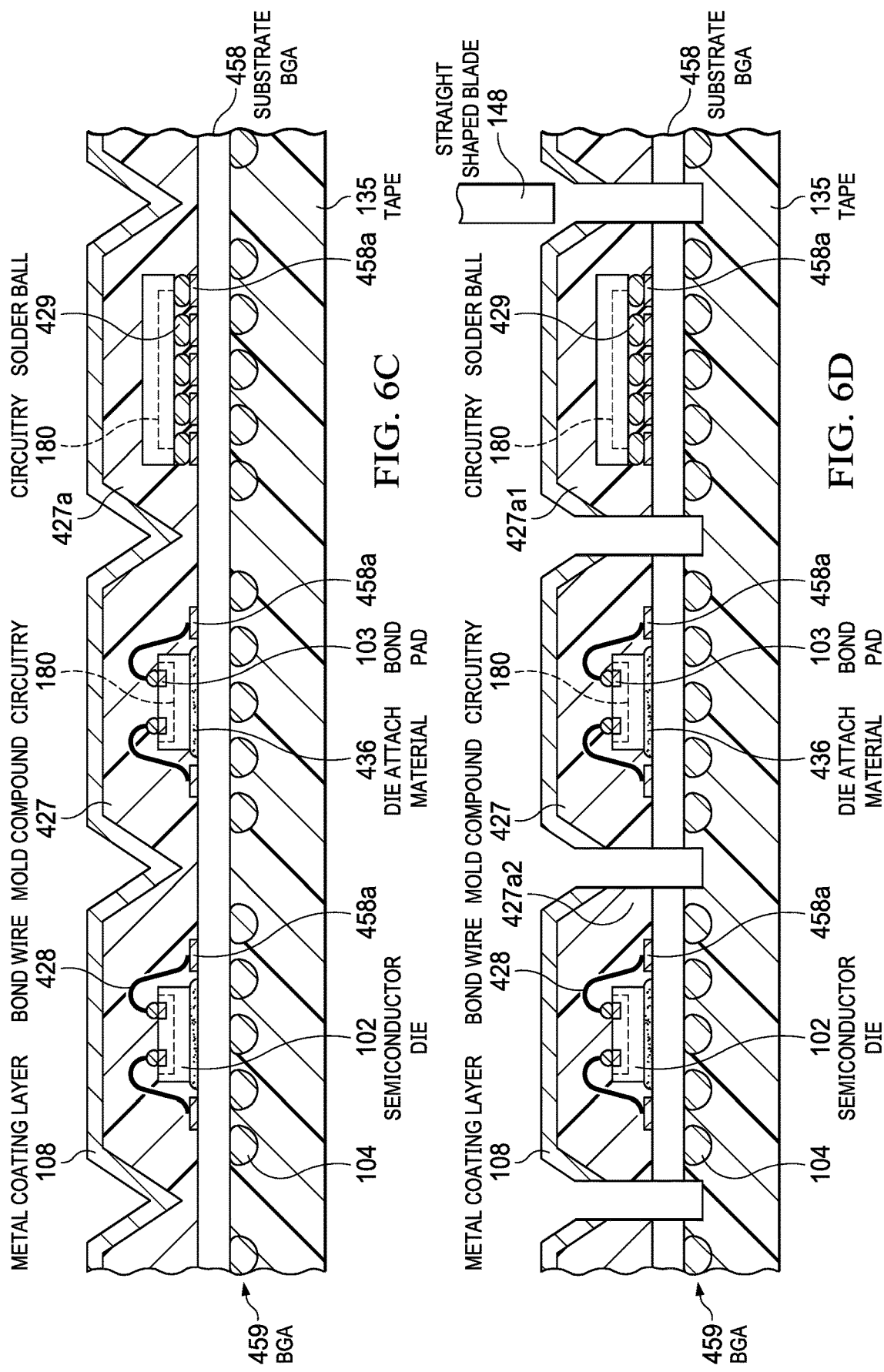

SEMICONDUCTOR DEVICE HAVING TAPERED METAL COATED SIDEWALLS

FIELD

This Disclosure relates to semiconductor devices, more specifically to structures for protecting circuitry on the semiconductor device from exposure to electromagnetic radiation, such as infrared radiation (IR).

BACKGROUND

During semiconductor device assembly manufacturing, after being singulated from a wafer, semiconductor chips commonly referred to as "dies" or "semiconductor dies" are typically mounted onto leadframes and are wire-bonded, clipped, or otherwise coupled (such as flipchip mounted) to leads of the leadframe. This semiconductor die on leadframe assembly is then generally covered in a mold compound, such as comprising an epoxy, to protect the semiconductor device from potentially damaging heat, physical trauma, moisture, and other possible deleterious factors. The finished assembly is generally called a semiconductor package or, more simply, a package.

There are other types of packages, such as a chip-scale packages (CSP) which may be considered to be unpackaged semiconductor die, as CSPs typically do not include a mold compound covering the semiconductor die. Rather, in many such CSPs, electrically conductive terminals (e.g., solder balls) are formed on bond pads on the active top side surface of the semiconductor die, and the die is then flipped onto an application, such as onto metal pads of a printed circuit board (PCB). As a result, the inactive bottom side surface and inactive sidewall surfaces of the die are exposed to the environment. These inactive surfaces of the semiconductor die can provide some partial shielding for the active (top side) areas of the die and other electrical connections from harmful influences. Such CSPs, for example, wafer-level CSPs (WL-CSP or WCSP), may be favored for their small size and reduced manufacturing costs as compared to conventional packages.

However, some unpackaged die such as CSP's operate best in application environments that are protected from certain wavelength ranges of electromagnetic radiation, such as protection from IR present in ambient light, because the semiconductor material of the die may be unable to sufficiently block transmission of certain ranges of electromagnetic radiation. For example, it is desirable to shield the semiconductor die from electromagnetic radiation having wavelengths greater than 700 nm (red light) which begins the IR, with the short wavelength part of the IR referred to as near-IR which extends to about 2 μm, although IR as generally defined in optics extends from the near-infrared to about 1 mm in wavelength. Because such IR is transmitted by common IC substrate materials such as silicon, the IR is able to penetrate from surfaces of the die through the substrate to reach semiconductor (pn) junctions. Such penetrating electromagnetic radiation imparts energy into the pn junctions which can cause unwanted carrier generation, and thus current flow which may be referred to as drift current in the circuitry of the semiconductor die that can result in the die having their performance affected, commonly being called light-sensitive die.

It is usually sufficient to protect the semiconductor die from IR and other electromagnetic radiation by placing the semiconductor die within an additional enclosure that blocks transmission of the light. However, some electronic systems need unpackaged semiconductor die to operate in conditions, such as when the semiconductor die is mounted on a PCB which exposes the die to ambient electromagnetic radiation which includes IR, as well as to other possible light sources which may be also mounted on the PCB. For example, such electronic systems may comprise cellular phones, pagers, and personal digital assistants (PDA's) which may generally include IR sources such as light emitting diodes (LEDs), or backlights. Such unpackaged semiconductor die should be shielded from these IR sources in order to operate properly in these environments. Conventionally, a layer of organic material, such as an epoxy, is applied to the sidewall surfaces and the bottom surfaces of an unpackaged semiconductor die, such as a WCSP, to try to block the transmission of IR from reaching the circuitry of the semiconductor die.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a semiconductor device comprising a semiconductor die having a top side surface comprising a semiconductor material including circuitry therein having bond pads connected to nodes in the circuitry, a bottom side surface, and sidewall surfaces between the top side surface and the bottom side surface. A metal coating layer includes a bottom side metal layer over the bottom side surface extending continuously to a sidewall metal layer on the sidewall surfaces. The sidewall metal layer defines a sidewall plane that is at an angle from 10° to 60° relative to a normal projected from a bottom plane defined by the bottom side metal layer.

Disclosed aspects also include assembly methods comprising a disclosed wafer cutting process that forms semiconductor die having tapered sidewalls (typically four sidewalls each lying in a different plane), where each sidewall surface includes a tapered cut (e.g., such as by using a tapered blade), with the cutting process beginning from the bottom side of the wafer. Alternatively, a mold compound can be formed over singulated ones of the semiconductor die, where the mold compound can be configured to provide the tapered sidewalls, where the metal coating layer is formed on top of the mold compound, and thus takes on the taper of the mold compound's tapered sidewalls.

BRIEF DESCRIPTION OF THE DRAWINGS

Reference will now be made to the accompanying drawings, which are not necessarily drawn to scale, wherein:

FIGS. 1A-D are successive cross-sectional views beginning from a wafer shown by example as a CSP wafer having a plurality of CSPs each comprising semiconductor die after various steps corresponding to an example method for forming an unpackaged semiconductor die having tapered sidewalls with a metal coating layer on the bottom side and the sidewall surfaces, according to an example. FIG. 1A shows the CSP wafer having scribe lines between the CSP, where the CSP wafer is mounted top (active) side down on a dicing tape. FIG. 1B shows the results after wafer cutting shown by example as mechanical sawing using a tapered angle blade. The cut between the adjacent die can be seen to provide an angle of about 60°. FIG. 1C shows the results after depositing a blanket metal coating layer that coats the bottom side surface as well as the sidewall surfaces of the die. FIG. 1D shows a single singulated CSP following singulating of the wafer generally comprising mechanically breaking the metal coating layer between the adjacent CSP.

FIGS. 2A-2E are successive cross-sectional views beginning from a wafer shown by example having a plurality of CSPs after various steps corresponding to an example method for forming an unpackaged semiconductor die having tapered sidewalls using a step cut, with a metal coating layer on the bottom side surface and on the sidewall surfaces, according to an example.

FIGS. 3A-3E are successive cross-sectional views of an example molded package process flow where there are semiconductor die on a leadframe after various steps, according to an example.

FIGS. 4A-4D are successive cross-sectional views of an example molded package process flow utilizing a single cut with a substrate BGA, where there is a semiconductor die on the substrate BGA, according to an example.

FIGS. 5A-5E are successive cross-sectional views of an example molded package process flow utilizing a step cut with the metal coating layer formed after the second cut, with a substrate BGA, where there is a semiconductor die on the substrate BGA, according to an example.

FIGS. 6A-6E are successive cross-sectional views of an example molded package process flow utilizing a step cut with the metal coating before a second cut, with a substrate BGA, where there is a semiconductor die on the substrate BGA, according to an example.

DETAILED DESCRIPTION

Figure 1C:
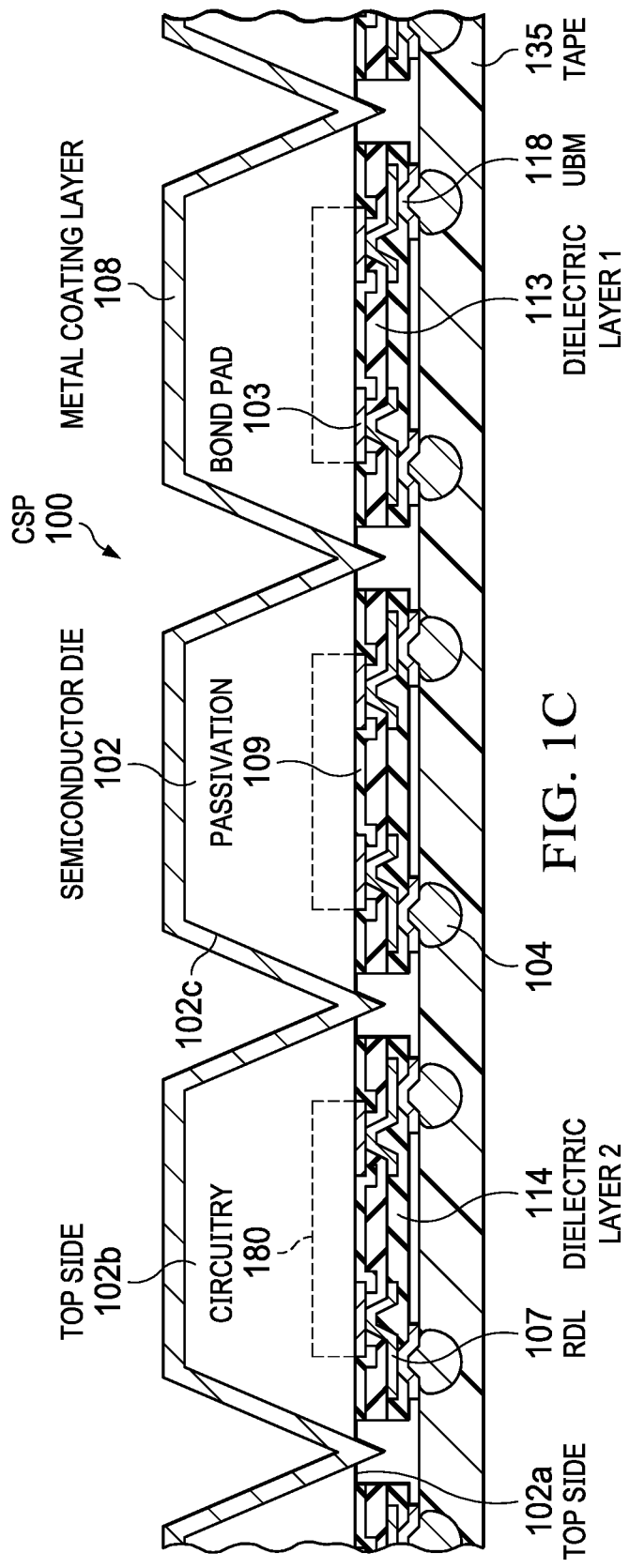

Examples are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize conventional wafer singulation processes (e.g., using a mechanical saw or a laser for laser drilling) for cutting through the thickness of the wafer in the scribe lines between the semiconductor die to generate individual (simulated) semiconductor die results in the semiconductor die having four essentially straight sidewall surfaces. Straight surfaces as used herein mean the sidewalls make a 90° angle with respect to the plane defined by the top side (active) surface and the plane defined by the bottom side surface of the semiconductor die. The cut regions in the scribe lines of the wafer between adjacent semiconductor die are generally narrow, such as being 5 µm to 100 µm wide. As a result, for a conventional wafer thickness at the time of singulation (which generally follows a wafer backgrind process) that is about 100 µm (when background) to 800 µm (when not background), so that a high aspect ratio volume, such as an aspect ratio of about 60, is present in the cut regions.

For assembly processes that include the step of depositing a metal coating layer on an unpackaged semiconductor die after wafer singulation while still being secured to an adhesive layer, such as to a dicing tape or other wafer holding apparatus, there is thus a high aspect ratio volume having essentially straight sidewalls between the adjacent semiconductor die to fill. The straight sidewalls make it effectively impossible for known deposition systems (e.g., sputtering systems) to uniformly coat the sidewall surfaces of the semiconductor die with a metal coating layer along its entire length. A thin metal coating layer, or no coating layer at all, may be present at and near the sidewall surface interfaces with the semiconductor die on the tape because it is the furthest surface region away from the sputtered material provided by the sputter deposition system.

A problem recognized by disclosed aspects is thus poor metal coating layer coverage on the sidewall surfaces of the semiconductor die near the sidewall surface nearest the tape after wafer cutting for semiconductor die that may be light-sensitive, where the semiconductor die includes a metal coating layer thereon that is applied after cutting (singulating) the wafer into individual die. In the case the wafer is cut while being top (active) side down on the tape, it is the sidewall surfaces adjacent to the top side surface that may have a relatively thin metal coating layer, or may have no metal coating layer at all. Such conventional poor metal coating layer step coverage on the sidewalls of the semiconductor die in the case of light-sensitive unpackaged semiconductor die may prompt the use of a relatively high-cost IR protection package or other arrangement (e.g., a metal can, metal paste coating, mold epoxy coating) because of the above-described high aspect ratio volume not being able to be properly filled by known metal coating deposition process (e.g., a deposition technique such as sputtering or a spray process).

The additional steps involved in providing an IR protection package results in a higher cost package, and also results in a more complicated assembly process flow. This high aspect ratio metal coating layer filling problem is solved by disclosed aspects which provide a semiconductor device including a metal coating layer that is light-resistant which is included on at least the sidewall surfaces, where the metal coating layer that defines a sidewall plane that is at an angle relative to a normal projected from a bottom plane defined by the bottom side metal layer. One disclosed aspect comprises a semiconductor device including a semiconductor die having a top side surface comprising a semiconductor material including circuitry therein having bond pads connected to nodes in the circuitry, a bottom side surface, and sidewall surfaces between the top side surface and the bottom side surface. A metal coating layer includes a bottom side metal layer that is over the bottom side surface that extends continuously to a sidewall metal layer on the sidewall surfaces.

The sidewall metal layer defines a sidewall plane that is at an angle from 10° to 60° relative to a normal projected from a bottom plane defined by the bottom side metal layer. FIG. 1D described below shows this angle as being θ. With θ as defined herein, a conventional straight (vertical) sidewall will be at 0° for its θ. A θ less than 10° is recognized herein to make it effectively impossible for a known deposition system (e.g., sputtering systems) to uniformly coat the sidewall surfaces of the semiconductor die with a metal coating layer along its entire length. A θ of 90° would result in the cut region being the entire die, and a θ of more than 60° although enabling an improved thickness uniformity of the metal coating layer on the sidewalls, would result in a cut region that wastes too much area (which would need the cut region to be designed by the circuit designer to be devoted to being in the scribe line as opposed to circuitry) to be economically reasonable. Disclosed tapered sidewalls at an angle from 10° to 60° can optionally be provided over the entire sidewall area.

Disclosed aspect thus solve the problem that may pose a worse problem for flipchip die or CSPs where electromagnetic radiation, particularly IR, which can be transmitted through the substrate of the die which generally comprises silicon, so that the IR can reach the junction areas resulting in carrier generation. Such carrier generation can thus affect operation of the active circuit. Disclosed aspects help prevent the influence of electromagnetic radiation including IR from being incident on the bottom side surface and the sidewall surfaces of the die by adding a metal coating layer generally over the bottom side surface and over the sidewall surfaces. Disclosed aspects although described generally with respect to CSP's such as WCSP's, apply generally to any type of packages, bare die, or a die with/without mold encapsulation. Disclosed aspects can be applied to generally any IC device that has an optical sensitivity, such as sensitivity to electromagnetic radiation in the IR, mmWave, or microwave range of the electromagnetic spectrum. When a mold compound is provided, the tapered metal coating layer can be under the mold compound, or can be over the mold compound.

FIGS. 1A-D are successive cross-sectional views beginning from a CSP wafer 110 shown by example having a plurality of semiconductor die 102, with scribe lines 111 shown in between the die shown as CSP 100. The CSP 100 comprises a semiconductor die 102 being shown after various steps corresponding to an example method for forming an unpackaged semiconductor die having tapered sidewalls and a metal coating layer 108 on the bottom side surface 102b and on the sidewall surfaces shown as 102c.

The CSPs 100 each include a top side structure comprising a first dielectric layer shown as dielectric layer 1 113 that is on top of a passivation layer 109 that has apertures exposing the bond pads 103 of the semiconductor die 102. A redistribution layer (RDL) 107, such as comprising copper, is over dielectric layer 1 113, where the RDL 107 makes electrical contact to the bond pads 103 through apertures in dielectric layer 1 113. An optional second dielectric layer shown as dielectric layer 2 114 is over the RDL 107. There is also a layer of under bump metallization (UBM) 118 that makes electrical contact to the RDL 107, and there is a solder ball 104 on the UBM 118. Although not shown, the CSP 100 besides the RDL comprising top structure shown, can also utilize a different top structure, such two or more RDLs, as well as other arrangements such as ball on pad (BOP), as well as BOP on copper over active (BOP-COA).

The semiconductor die 102 includes a top side surface 102a and a bottom side surface 102b mounted with its top side surface 102a facing down onto a dicing tape 135. The solder balls 104 are electrically coupled by RDL 107 to the bond pads 103 which are electrically coupled to nodes of the circuitry 180 of the semiconductor die 102, where the solder balls 104 shown in FIG. 1B described below can be seen to be adhered to the dicing tape 135 after the CSP wafer 110 is placed on the dicing tape 135. Alternatives to a dicing tape 135 can generally include any material which can function as an affixing system to affix the wafer or the dies, such as a tacky tape, or an ultraviolet (UV) tape.

The circuitry 180 comprises circuit elements (including transistors, and generally diodes, resistors, capacitors, etc.) that may optionally be formed in an epitaxial layer on a bulk substrate material, such as comprising silicon, where the circuitry 180 includes nodes coupled to bond pads 103, where the circuitry 180 is configured together for generally realizing at least one circuit function. Example circuit functions include analog (e.g., amplifier or power converter), radio frequency (RF), digital, or non-volatile memory functions.

FIG. 1B shows the results after cutting the CSP wafer 110 while on the dicing tape 135 shown by example as mechanical sawing using a tapered angle (tapered) blade 145. Alternatively, for the cutting step other processes may generally be used such as plasma etching, laser, and wet-chemical etching, or generally any other method able to form a tapered shape on the sidewalls 102c of the semiconductor die 102.

Figure 1D:
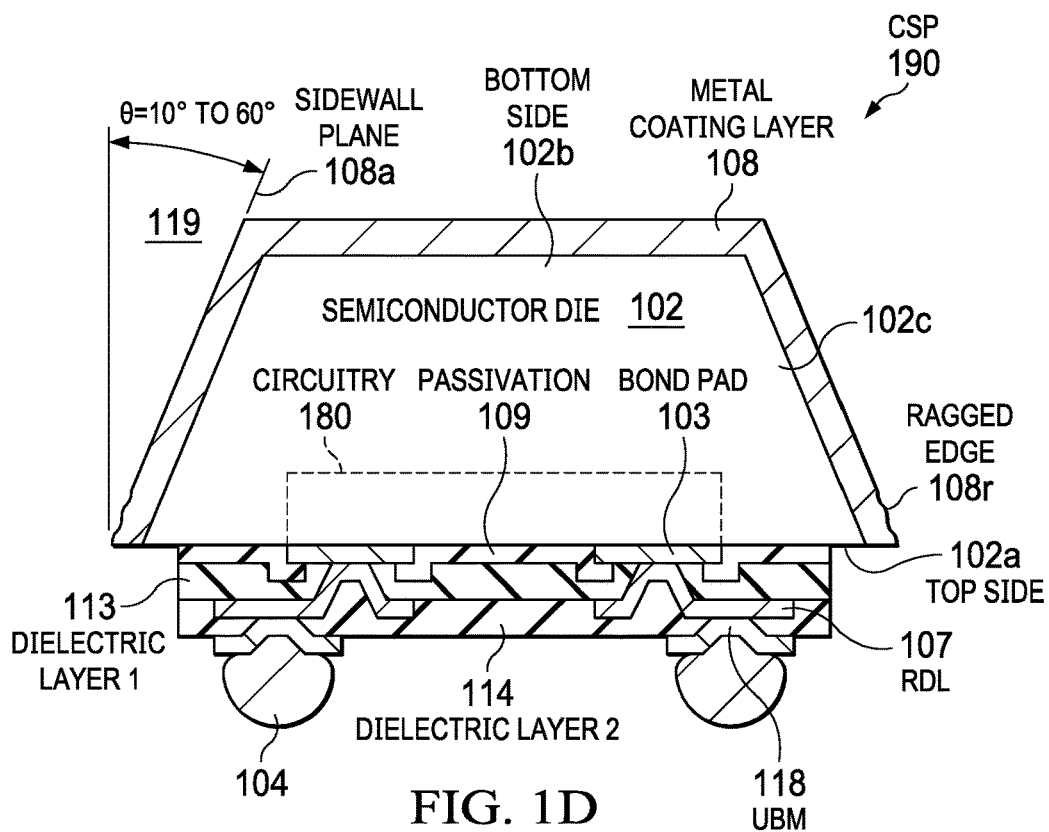

The cuts are in the scribe lines 111 shown in FIG. 1A that are thus between the semiconductor die 102, where the cuts can be seen to be V-shaped cuts providing an opening with an angle of about 60° for the opening itself. Upon later described wafer singulation, this results in the sidewall surfaces 102c of each CSP defining a plane that makes an angle of about 30° with respect to the plane defined by the bottom side surface 102b. FIG. 1C shows the results after depositing a metal coating layer 108 as a blanket layer that coats the bottom side surface 102b of the semiconductor die 102, as well as the sidewall surfaces 102c.

The metal coating layer 108 can comprise a variety of different metals. For example, the metal coating layer 108 comprise at least one metal selected from aluminum, copper, gold, titanium, nickel, silver, palladium, and tin. Enabled by the disclosed sloped sidewall surfaces 102c, the thickness of the metal coating layer 108 can be seen to be substantially uniform throughout. The metal coating layer 108 is generally over an entire area of each of the sidewall surfaces 102c and over an entire area of the bottom side surface 102b, including at least an 80% thickness for the sidewall surfaces' interface the top side surface relative to an average thickness of the metal coating layer 108 on the bottom side surface.

FIG. 1D shows a single singulated CSP now shown as CSP 190 following singulating the CSP wafer 110 generally by mechanically breaking through the metal coating layer 108 in the scribe lines between adjacent ones of the semiconductor die 102, and then removing by generally picking the singulated ones of the CSP 190 from the dicing tape 135. The mechanically breaking can be implemented by a picking process enabled by the mechanical weakness of the metal coating layer 108 that as described above is generally a thin layer, which enables mechanically breaking (e.g., using a pick process) the metal coating layer 108 in scribe line locations. Other wafer singulation processes can also be used.

Because the thickness of the metal coating layer 108 may be thin (such as having an average thickness of 1 nm to 5 μm, for example, 50 nm to 500 nm), the adhesion to the semiconductor die 102 is generally strong enough to prevent the metal coating layer 108 from breaking or cracking during the dicing tape 135 removal process. The metal coating layer 108 can be seen to uniformly coat the bottom side surface 102b, as well as the sidewall surfaces 102c of the CSP 190. The metal coating layer 108 on the sidewall surfaces 102c of the CSP 190 can be seen to define a sidewall plane shown as 108a that is shown at an angle shown by (θ) that is from 10° to 60° relative to a normal 119 that is parallel to a normal projected from a bottom plane defined by the metal coating layer 108 on the bottom side surface 102b that is referred to herein as a bottom side metal layer. The sidewall surfaces 102c can number 4, and an interface with the bottom side surface 102b can each be linear surfaces that are at an angle of at least 25° relative to a normal projection drawn down from the top side surface 102a or the bottom side surface 102b.

The metal coating layer 108 is shown in FIG. 1D having a uniform thickness on the bottom side surface 102b of the CSP 190, with the same uniform thickness extending to the sidewall surfaces 102c for most of the distance towards the top side (active) surface 102a of the CSP 190. The thickness of the metal coating layer 108 along the sidewall surface 102c near the interface with the topside surface 102a can be seen to be somewhat thinner, such as being about 5% to 10% thinner (less relative thinning as the cut angle is increased) as compared to the metal coating layer 108 thickness on other surfaces of the CSP 190. The area of the sidewall surfaces 102c where the metal coating layer 108 was generally mechanically broken to accomplish singulation also evidences a ragged (uneven) edge pattern shown as a ragged edge 108r.

Figure 2E:
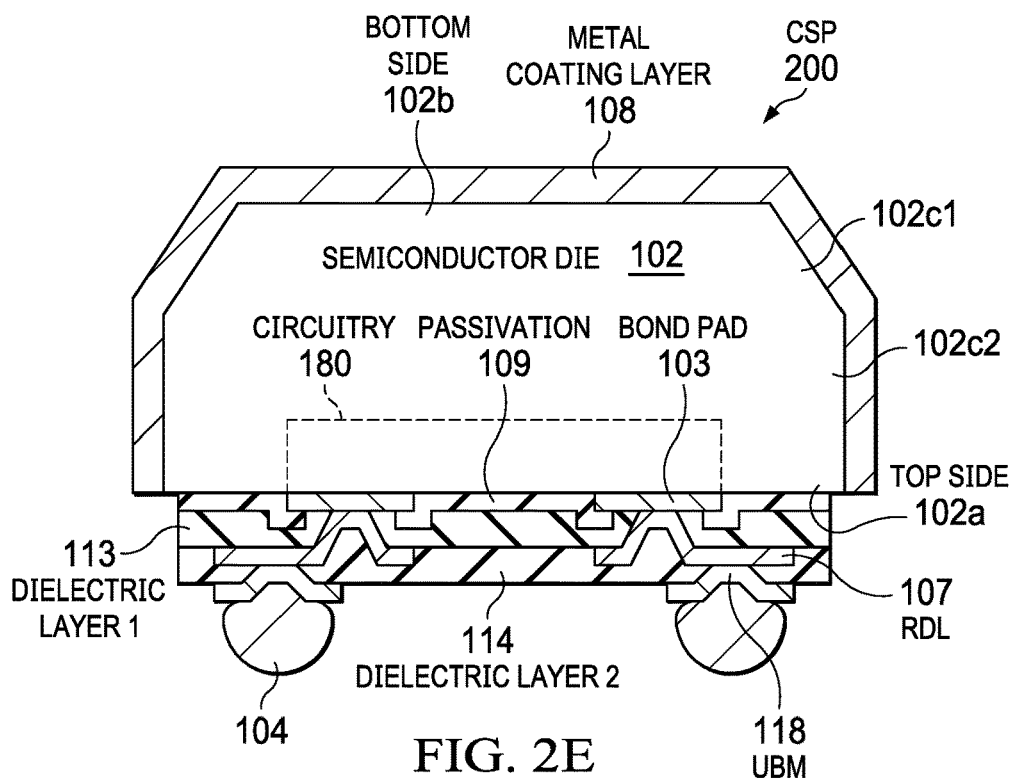
Figure 2A:
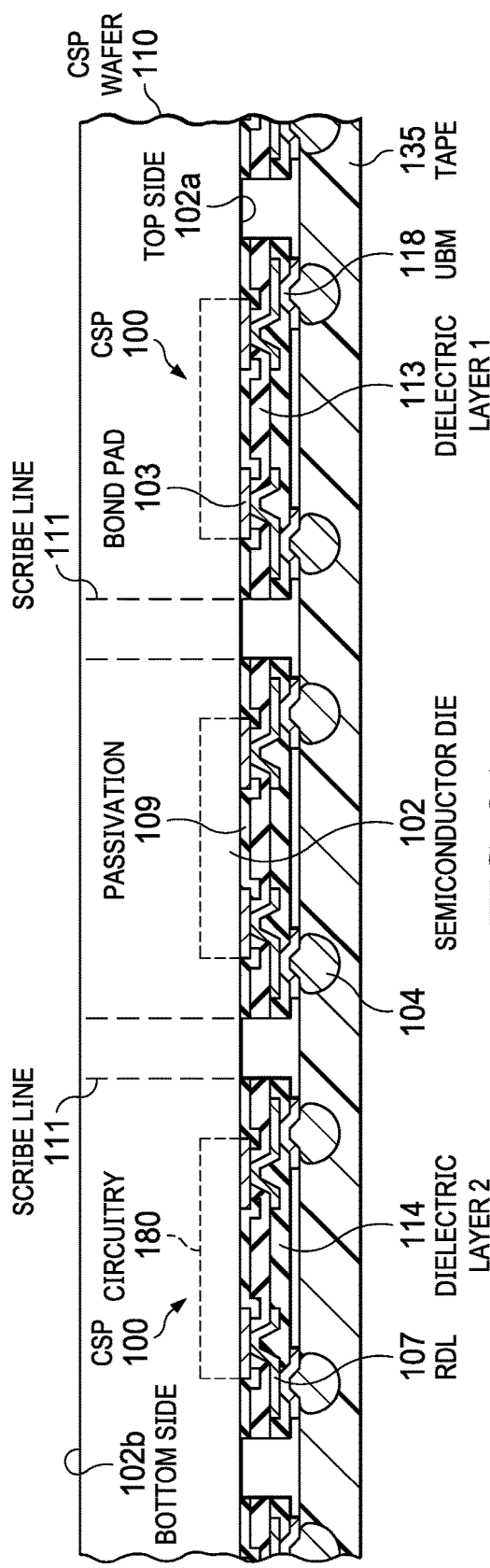
Figure 2B:
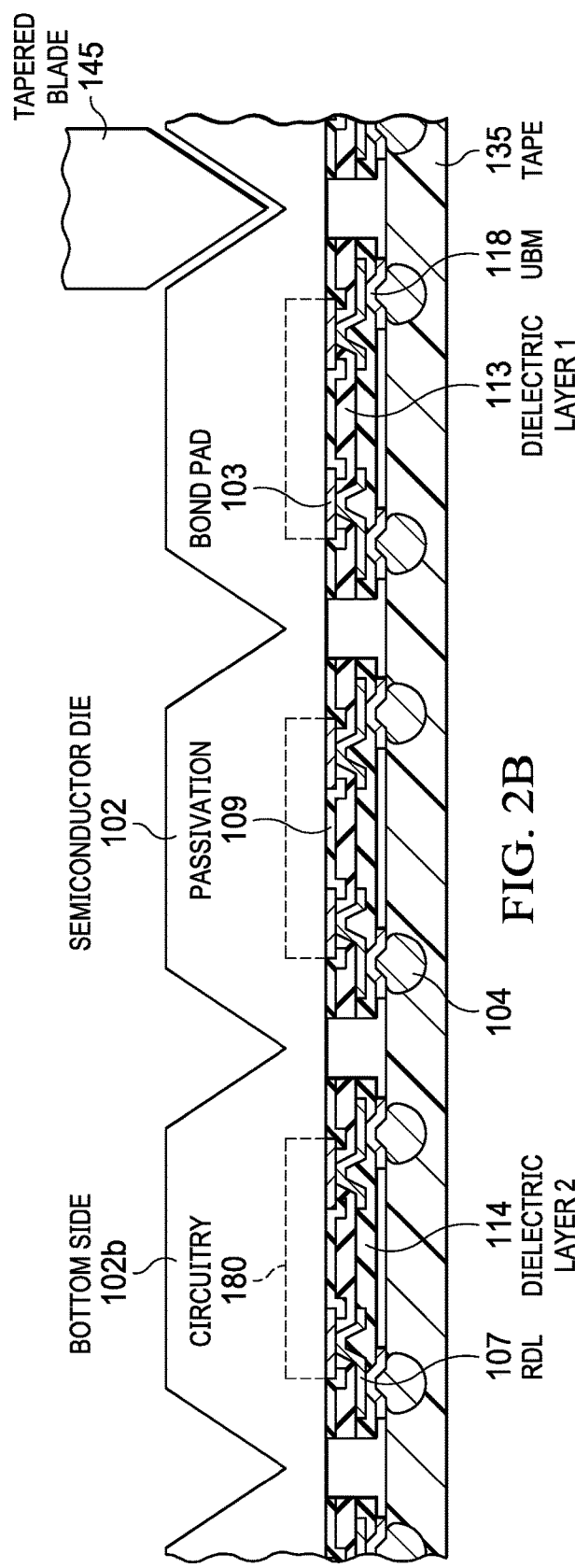

FIGS. 2A-2E are successive cross-sectional views beginning from a CSP wafer 110 shown by example having a plurality of CSP 100 after various steps corresponding to an example method for forming an unpackaged semiconductor die having tapered sidewalls using a step cut, with a metal coating layer 108 formed on the bottom side surface and the sidewall surfaces. FIG. 2A shows a CSP wafer 100 after being mounted top side down on a dicing tape 135. FIG. 2B shows a first step cut made by a tapered blade 145, where the cutting stops approximately at the middle of the thickness of the CSP wafer 110. FIG. 2C shows a second step cut made by a straight shaped blade 148 that is shown cutting through the remaining thickness of the wafer including a cut into the tape 135. The sidewall surface is shown as 102c1 for the tapered portion and 102c2 for the straight sidewall portion.

FIG. 2D shows the in-process CSP wafer 110 after forming the metal coating layer 108 on the bottom side surface 102b and on the sidewall surfaces 102c1, 102c2 of the semiconductor die 102. FIG. 2E shows a single CSP 200 after a die picking step that provides singulation, which as described above can be accomplished by mechanically breaking the metal coating layer 108 between the adjacent semiconductor die 102 using a picking process to provide the CSP 200.

Figure 3A:
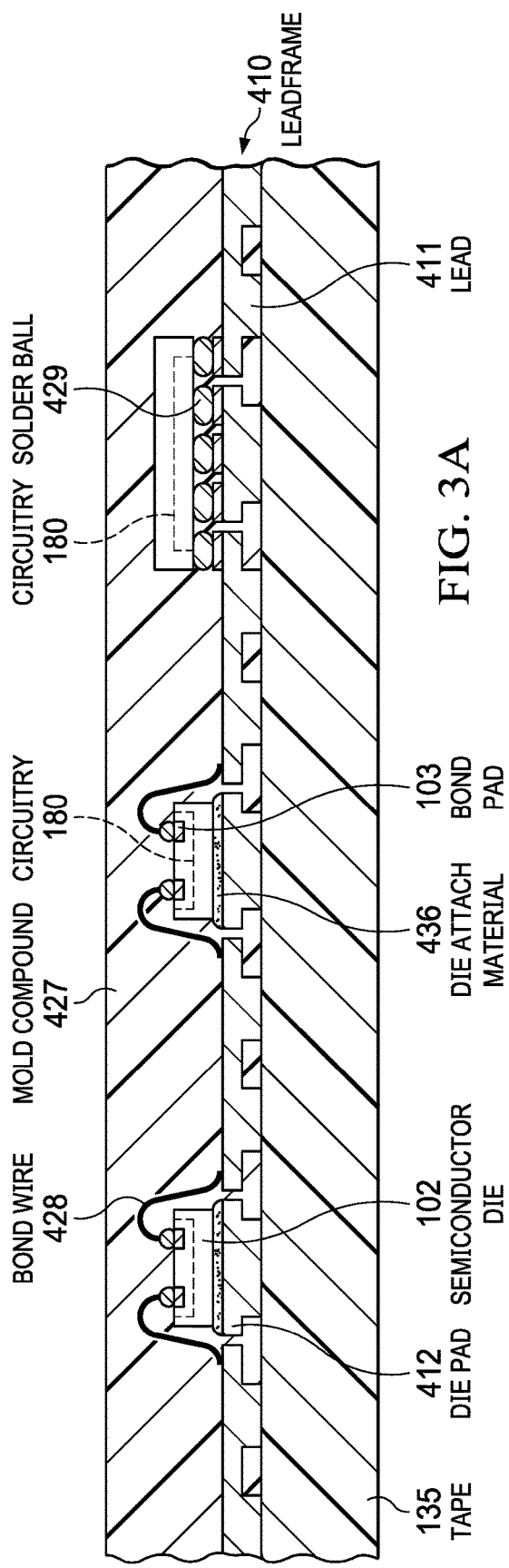

FIGS. 3A-3E are successive cross-sectional views of an example molded package process flow, where there are semiconductor die 102 on a leadframe 410, with a plurality of leadframes 410 together shown as a leadframe sheet, after various steps. The semiconductor die 102 need not be CSP's. FIG. 3A shows what can be regarded as a molded strip (or molded panel) that includes a leadframe sheet including a plurality of leadframes 410 that each include leads 411, with a plurality of semiconductor die 102 shown wirebonded by bond wires 428 to some of the leadframes 410, and some of the semiconductor die 102 being flipchip mounted by solder balls 429 onto other of the leadframes 410, all being within a mold compound 427. Each semiconductor die 102, together with its leadframe and bond wires or solder balls attached to the leads 411 of the leadframe, with its mold compound 427 can be considered to be a molded package.

Figure 3B:
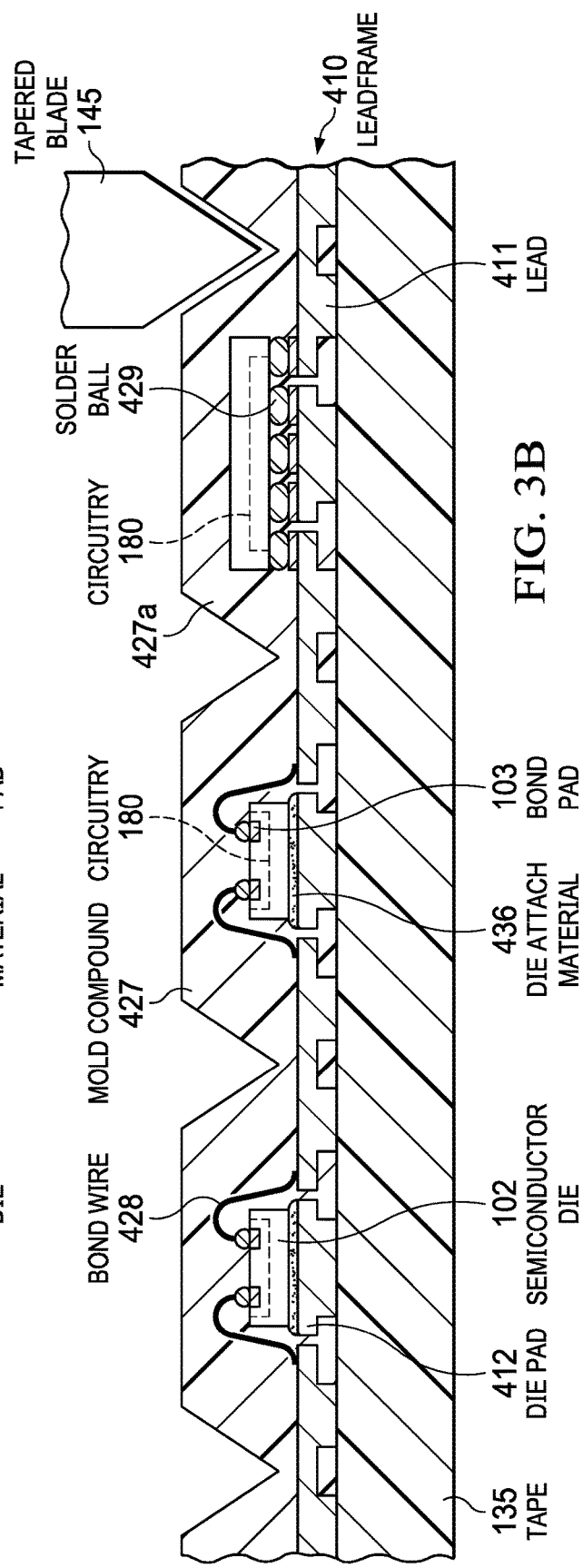

FIG. 3B shows the results after a first step cut using a tapered blade 145 that stops approximately at the middle of the thickness of the mold compound 427. The tapered sidewall portion of the mold compound 427 shown as 427a. FIG. 3C shows the results after forming a metal coating layer 108 over the mold compound 427 including over the tapered sidewall portion 427a. FIG. 3D shows the results after a second step cut straight shaped blade 148 that is shown cutting into the dicing tape 135 to provide die singulation. FIG. 3E shows a single semiconductor device shown as 350 for a wirebond package and 380 for a flipchip package, both after a die picking step.

FIGS. 4A-4D are successive cross-sectional views of an example molded package process flow utilizing a single cut using a substrate having a BGA on its bottom side (substrate BGA) 458 with the BGA shown separately as 459, where there are semiconductor die 102 on the topside of the substrate BGA 458. Although not shown, the substrate BGA 458 in this process flow and elsewhere in this Disclosure generally includes a plurality of layers, including electrically conductive vertical connections provided by filed vias between the adjacent metal layers running a connection from the top surface to the solder balls 104 of the BGA 459. The semiconductor die 102 need not be CSP's.

FIG. 4A shows the results after mounting what can be termed a molded strip that includes a plurality of the semiconductor die 102 within a mold compound 427 on the substrate BGA 458 having metal pads 458a on its top side, and a BGA 459 including a plurality of solder balls 104 on a bottom side which is shown on a dicing tape 135. The molded strip is shown for both wirebond arrangements including bond wires 428 where the bottom side of the semiconductor die 102 is shown attached to the substrate BGA 458 by a die attach material 436, and flipchip arrangements implemented with solder balls 429 including over the bond pads 103 of the semiconductor die 102 that electrically contact the metal pads 458a on a topside of the substrate BGA 458.

Figure 4C:
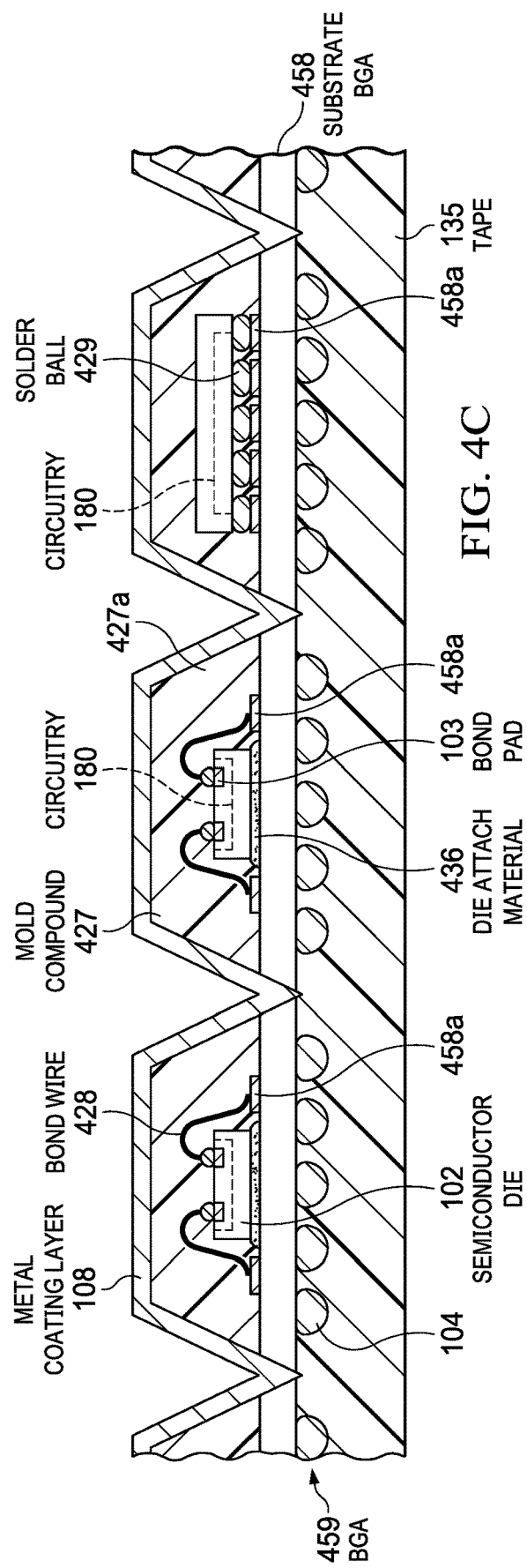
Figure 4D:
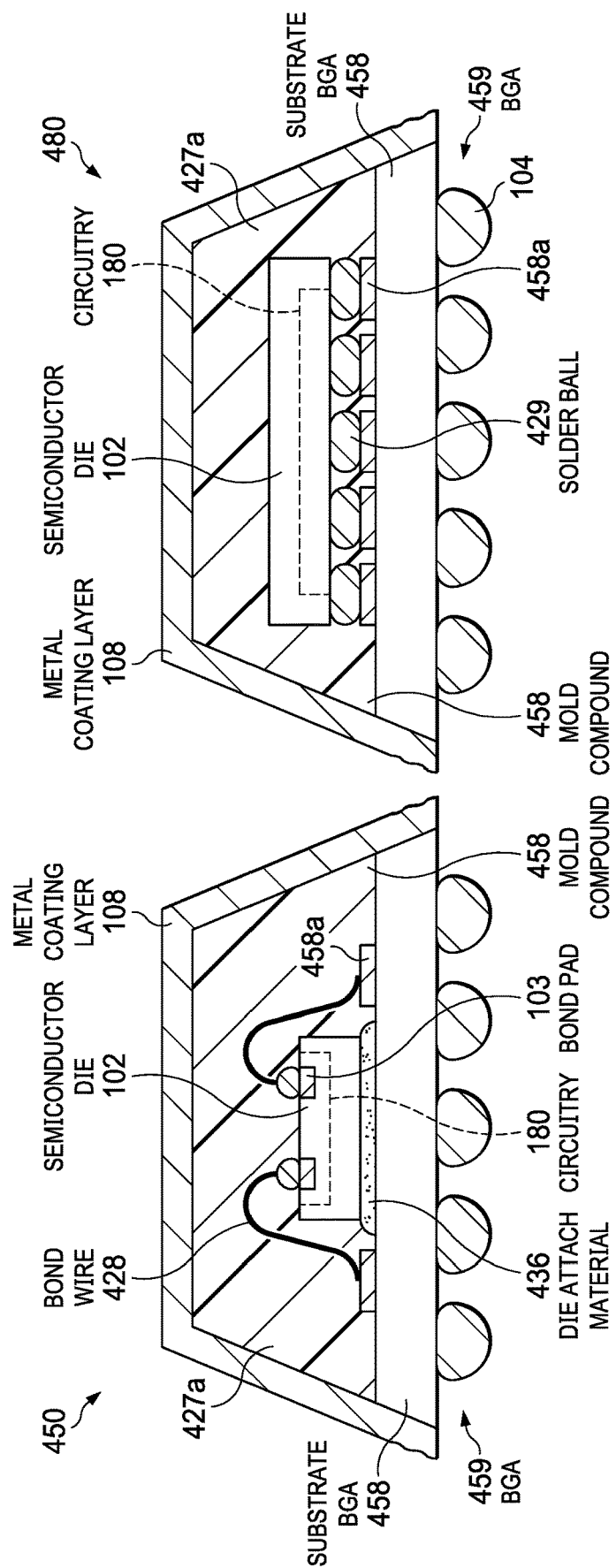

FIG. 4B shows the results after cutting through the mold compound 427 using a tapered blade 145 that continues until cutting into the tape 135. The tapered sidewall of the mold compound 427 is shown as 427a. FIG. 4C shows the results after depositing a metal coating layer 108 including over the mold compound 427, where the metal coating layer 108 where over the tapered portion 427 takes on the taper of the tapered sidewall portion 427*a* shown in FIG. 4C. FIG. 4D shows a single molded package shown as 450 for a wirebond package and 480 for a flipchip package after a package picking step that provides package singulation, which as described can break the metal coating layer 108 between the adjacent packages.

Figure 5E:
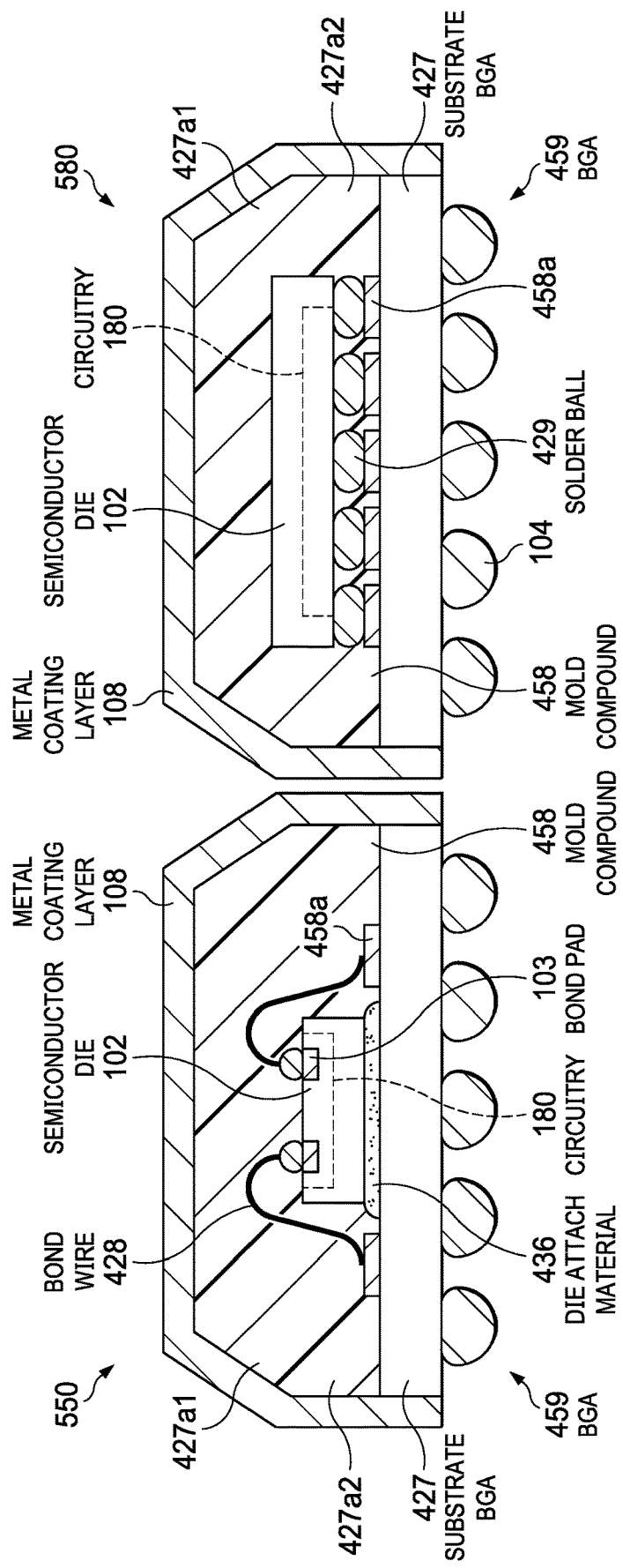

FIGS. 5A-5E are successive cross-sectional views of an example molded package process flow utilizing a step cut (2 cuts) with the metal coating layer 108 applied after the second cut, including a substrate BGA 458 having a BGA 459, where there is a molded strip comprising a plurality of semiconductor die 102 within a mold compound 427, where the molded strip is on the substrate BGA 458. FIG. 5A shows results after mounting the molded strip on a top surface of a substrate BGA 458 that has its bottom surface on a dicing tape 135. The molded strip is again shown for both wirebond arrangements having bond wires 428 with the die attach material shown as 436, and flipchip arrangements with solder balls 429 on the bond pads 103 of the semiconductor die 102 which contact the metal pads 458*a* of the top surface of the substrate BGA 458.

FIG. 5B shows the results after a first step cut for cutting through the mold compound 427 using a tapered blade 145 that continues until cutting into the mold compound 427 at a depth of about half the thickness of the semiconductor die 102. The tapered sidewall of the mold compound is shown as 427*a*. FIG. 5C shows the results after a second step cut with a straight shaped blade 148 that cuts through the remaining thickness of the mold compound 427 to provide the straight sidewall portion 427*a*2 that is below a tapered sidewall portion now shown as 427*a*1, and continues until cutting completely through the thickness of the substrate BGA 458 including cutting into the top of the dicing tape 135. FIG. 5D shows the results after depositing a metal coating layer 108 over the structure shown in FIG. 5C. FIG. 5E shows single molded packages package shown as 550 for a wirebond package and 580 for a flipchip package after a package picking step that provides package singulation, which as described above can break the metal coating layer 108 in between the packages.

Figure 6E:
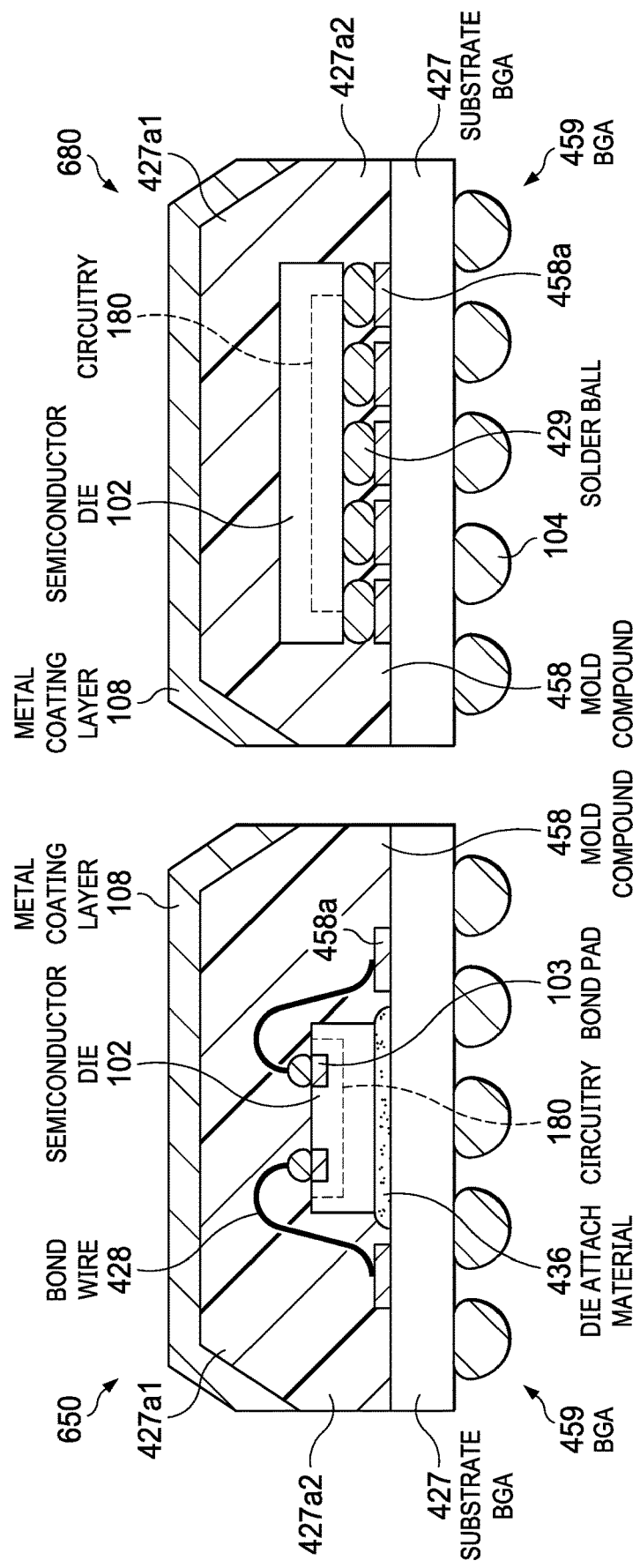

FIGS. 6A-6E are successive cross-sectional views of an example molded package process flow utilizing a step cut with the metal coating layer 108 applied before a second cut, with a substrate BGA 458, where there is a molded strip including a plurality of semiconductor die 102 within a mold compound 427 with the bond pads of the semiconductor die 102 connected to the metal pads 458*a* on the top surface of the substrate BGA 458 which includes a BGA 459. FIG. 6A shows results after mounting the molded strip on a substrate BGA 458 on a tape 135, where the molded strip is shown including both wirebond arrangements having bond wires 428 and flipchip arrangements with solder balls 429 on the bond pads 103 of the semiconductor die 102. FIG. 6B shows the results after a first step cut for cutting through the mold compound 427 using a tapered blade 145 that continues until cutting into roughly half the thickness of the mold compound 427, with the tapered sidewall shown as 427*a*. FIG. 6C shows the results after depositing a metal coating layer 108 on the structure shown in FIG. 6B.

FIG. 6D shows the results after a second step cut using a straight shaped blade 148 that cuts through the remaining thickness of the mold compound 427 and continues until cutting until reaching into the top of the tape 135. The tapered sidewall portion of the mold compound is now shown as 427*a*1, and the straight sidewall portion is now shown as 427*a*2. FIG. 6E shows the single molded wirebond package shown as 650 and 680 for a molded flipchip package after a package picking step that provides package singulation, which as described above can break the metal coating layer 108 between the packages.

Figure 7A:
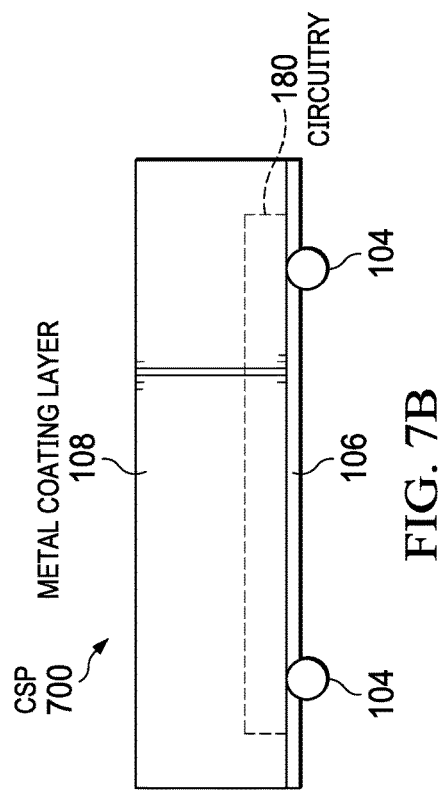
FIG. 7A depicts a cross-sectional view of an example semiconductor package having a disclosed metal coating layer.

FIG. 7A depicts a cross-sectional view of a semiconductor package 700 having a disclosed metal coating layer 108. Specifically, FIG. 7A depicts a semiconductor package 700. The semiconductor package 700 shown is a CSP. For example, the semiconductor package 700 can be a WCSP. Other types of CSPs also may be used. The semiconductor package 700 comprises a semiconductor die 102 which may comprise any suitable semiconductor material, such as silicon, for example. In some examples, the semiconductor die 102 comprises a semiconductor material such as silicon that is susceptible to light transmission and thus light penetration, for example, IR penetration. The bottom surface 102*b* of the semiconductor die 102 is an active surface that comprises circuitry 180 formed thereupon and therein which abuts a miscellaneous layer shown as 106.

The miscellaneous layer 106 may comprise any of a variety of materials and sub-layers to facilitate an electrical connection between the bond pads 103 shown in FIG. 1A of the semiconductor die 102 and electrically conductive terminals shown as solder balls 104, depending on the application and the specific configuration of the semiconductor package 700. For example, the miscellaneous layer 106 may comprise dielectrics including polyimides, metal traces, passivation, coatings, etc. The specific composition of the miscellaneous layer 106 is not described in detail herein because it may vary depending on the particular application and because it is not directly relevant to the disclosed features described herein. In general, however, the composition of the miscellaneous layer 106 is open-ended and is not limited to any particular number, types, or configurations of sub-layers.

The semiconductor package 700 comprises the aforementioned electrically conductive terminals shown as solder balls 104. Although FIG. 7A only depicts two illustrative terminals shown as solder balls 104, generally, any number of conductive terminals may be used. The terminals may generally be of any suitable size, and the terminals although shown spherical are not necessarily spherical. The terminals couple to the top surface 102*a* of the die 102 via the miscellaneous layer 106, for example, via metal traces in the miscellaneous layer 106 or using a direct connection to active areas of the top surface 102*a* of the semiconductor die 102.

The semiconductor die 102 comprises multiple surfaces (e.g., six surfaces). Each of the multiple surfaces of the semiconductor die 102 lies in a different plane. For instance, the bottom surface 102*b* of the semiconductor die 102 that abuts the miscellaneous layer 106 lies in a first plane, the top surface of the semiconductor die 102 that opposes the bottom surface lies in a second plane that is different than the first plane, and each of the four lateral sides of the semiconductor die 102 lies in a separate plane that is different than the other five planes of the semiconductor die 102.

In some examples, the semiconductor package 700 comprises a metal coating layer 108 that covers five of the six surfaces of the die 102. In some examples, the metal coating layer 108 does not cover the top surface 102*a* of the semiconductor die 102, but it covers the remaining five surfaces of the semiconductor die 102 (e.g., the inactive surfaces of the semiconductor die 102). In examples where the semiconductor die 102 has a different number of surfaces than six, it may be said that the metal coating layer 108 covers all surfaces except for the active surface of the semiconductor die 102. The remainder of this discussion assumes a semiconductor die 102 with six surfaces, with the top surface 102a being the active surface of the semiconductor die 102.

In some examples, the metal coating layer 108 covers each of the five surfaces (excluding the top surface 102a) entirely so that there are no gaps in metal coating layer 108 coverage. In some examples, the metal coating layer 108 covers a majority (i.e., more than 50%) of each of the five surfaces. In some examples, the metal coating layer 108 covers at least one surface entirely and the majority of at least one other surface. In some examples, the metal coating layer 108 covers each of the five surfaces at least partially. In some examples, the metal coating layer 108 covers the five surfaces with varying combinations of entire coverage, majority coverage, and/or partial coverage, and all such combinations are contemplated and included in the scope of this Disclosure. In some examples, the metal coating layer 108 covers fewer than five surfaces but at least one surface.

In some examples, the metal coating layer 108 has an approximate thickness of 750 Angstroms (Å), such as being 500 Å to 1,000 Å thick. In some examples, the metal coating layer 108 comprises aluminum, copper, gold, titanium, nickel, silver, palladium, or tin. In some examples, the metal coating layer 108 comprises an alloy, such as a tungsten-titanium alloy or stainless steel. A variety of techniques are usable to position the metal coating layer 108, including metallic ink printing, sputtering, deposition, electro-less plating, spray techniques, and electroplating, as described below.

Figure 7B:
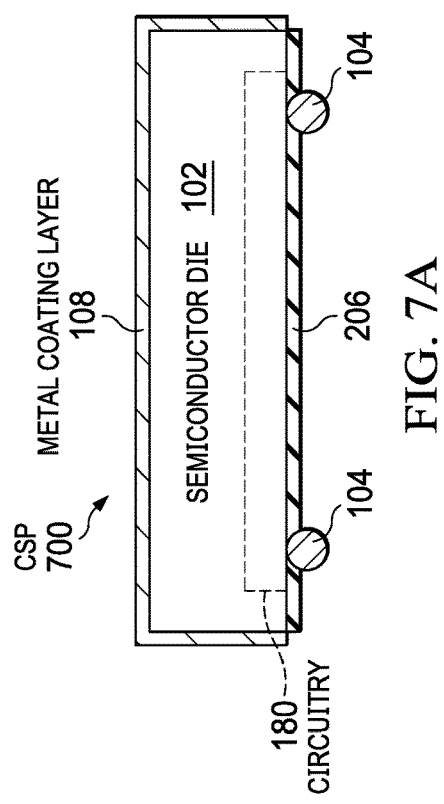
FIG. 7B depicts a profile view of a semiconductor package having a disclosed metal coating layer.

FIG. 7B depicts a profile view of the package 700, in accordance with various examples. As shown, the metal coating layer 108 covers a lateral side surface of the semiconductor die 102 (with the semiconductor die 102 not being expressly visible in FIG. 7B). The view of FIG. 7B is representative of the views of the four lateral sides of the semiconductor package 700.

Figure 7C:
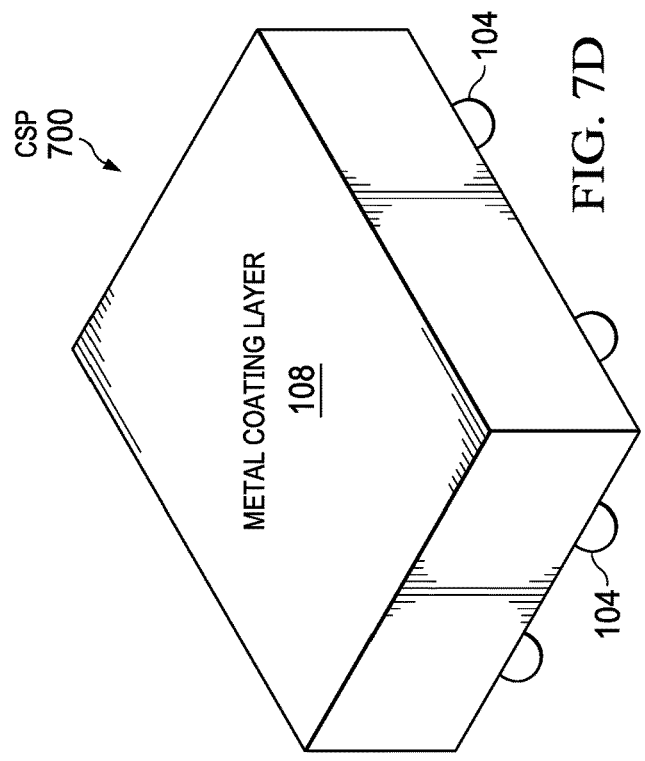
FIG. 7C depicts a top-down view of a semiconductor package having a disclosed metal covering layer.
Figure 7D:
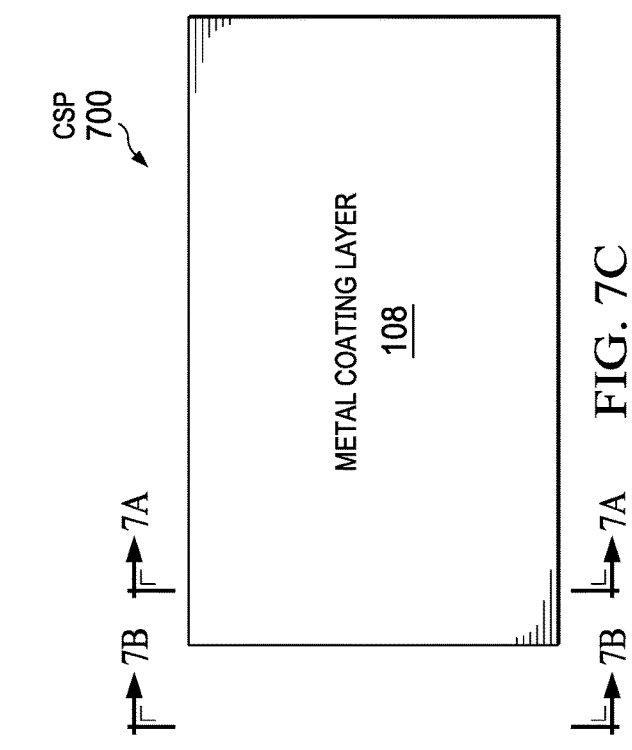
FIG. 7D depicts a perspective view of a semiconductor package having a disclosed metal coating layer.

FIG. 7C depicts a top-down view of the semiconductor package 700, in accordance with various examples. As shown, the top surface of the semiconductor package 700 includes the metal coating layer 108. FIG. 7D depicts a perspective view of the semiconductor package 700, in accordance with various examples. As depicted, the bottom surface 102b of the semiconductor package 700 and the four lateral sides of the package 700 include the metal coating layer 108. The active, top surface 102a of the semiconductor die 102 couples to the electrically conductive terminals shown as solder balls 104 via the miscellaneous layer 106, where the miscellaneous layer 106 is not visible from the angle of view of FIG. 7D.

Figure 8A:
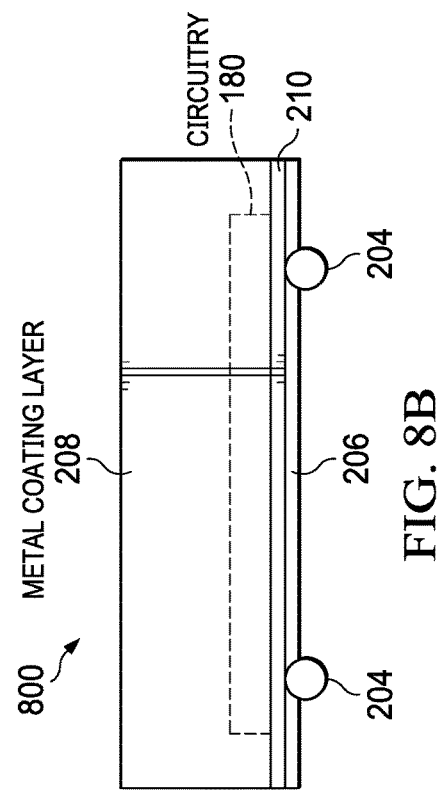
FIGS. 8A-8D show the semiconductor package having a disclosed metal coating layer shown in FIGS. 7A-7D, respectively now with an added dielectric layer under the metal coating layer.
Figure 8B:
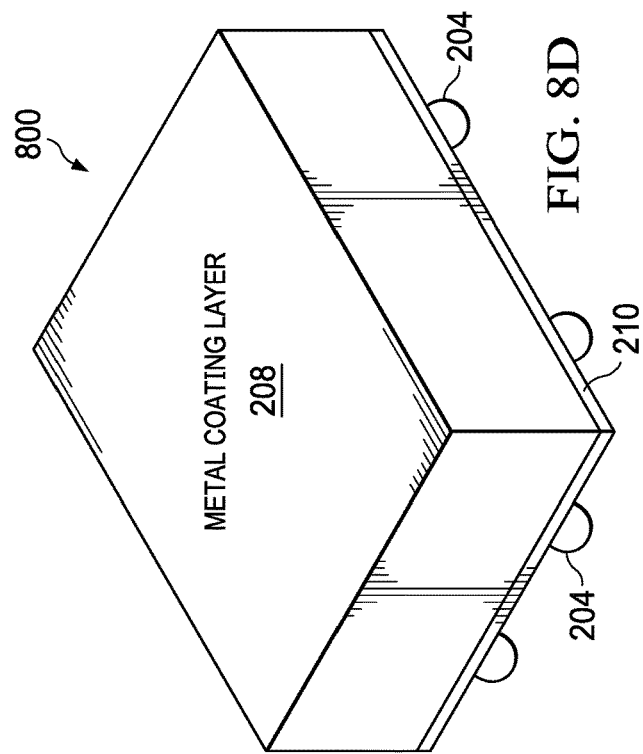
Figure 8C:
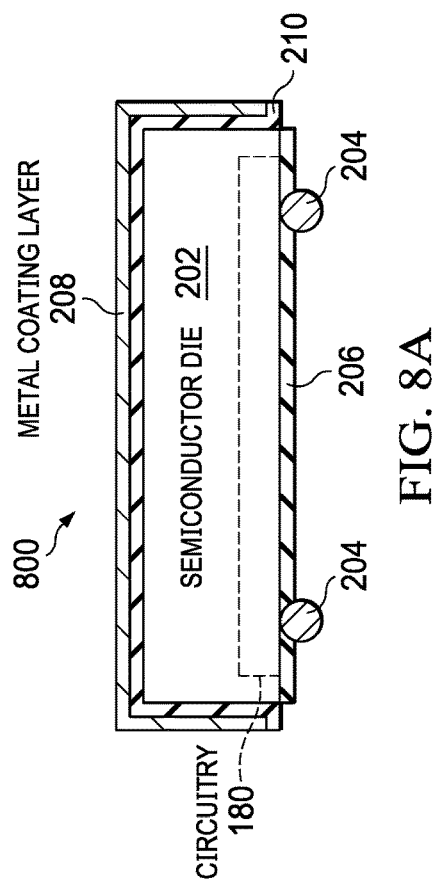
Figure 8D:
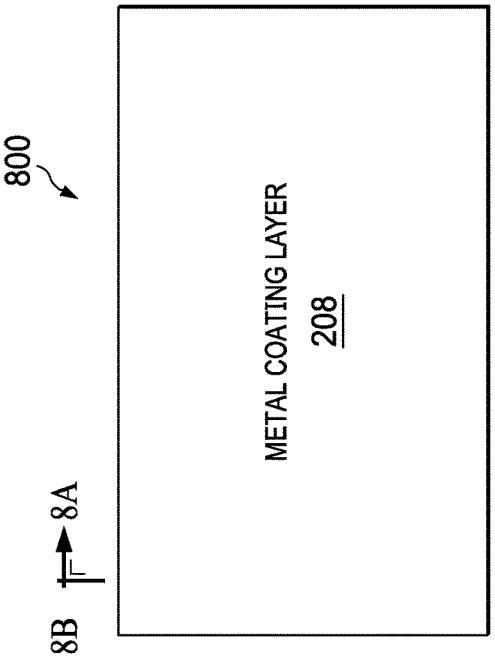

FIG. 8A depicts a cross-sectional view of a semiconductor package 800 having a dielectric layer 210 and a metal coating layer now shown as 208, in accordance with various examples. In FIGS. 8A to 8D, the semiconductor die is now shown is 202 and the miscellaneous layer as 206. Specifically, FIG. 8A depicts a semiconductor package 800, which comprises a CSP (e.g., a WCSP). The semiconductor package 800 comprises a semiconductor die 202, electrically conductive terminals 204, and a miscellaneous layer 206. In at least some examples, the semiconductor die 202, the electrically conductive terminals 204, and the miscellaneous layer 206 are similar or virtually identical to the semiconductor die 102, the electrically conductive terminals 104, and the miscellaneous layer 106 of FIGS. 7A-7D, respectively, described below. Thus, the description provided above for elements 102, 104, and 106 relative to FIGS. 7A-7D also applies in at least some examples to the elements 202, 204, and 206 shown in FIGS. 8A-8D. As noted above, the dielectric layer 210 functions as an electrical isolator (dielectric), but generally not providing any significant protection for the semiconductor die 202 from electromagnetic radiation such as IR.

Figure 9:
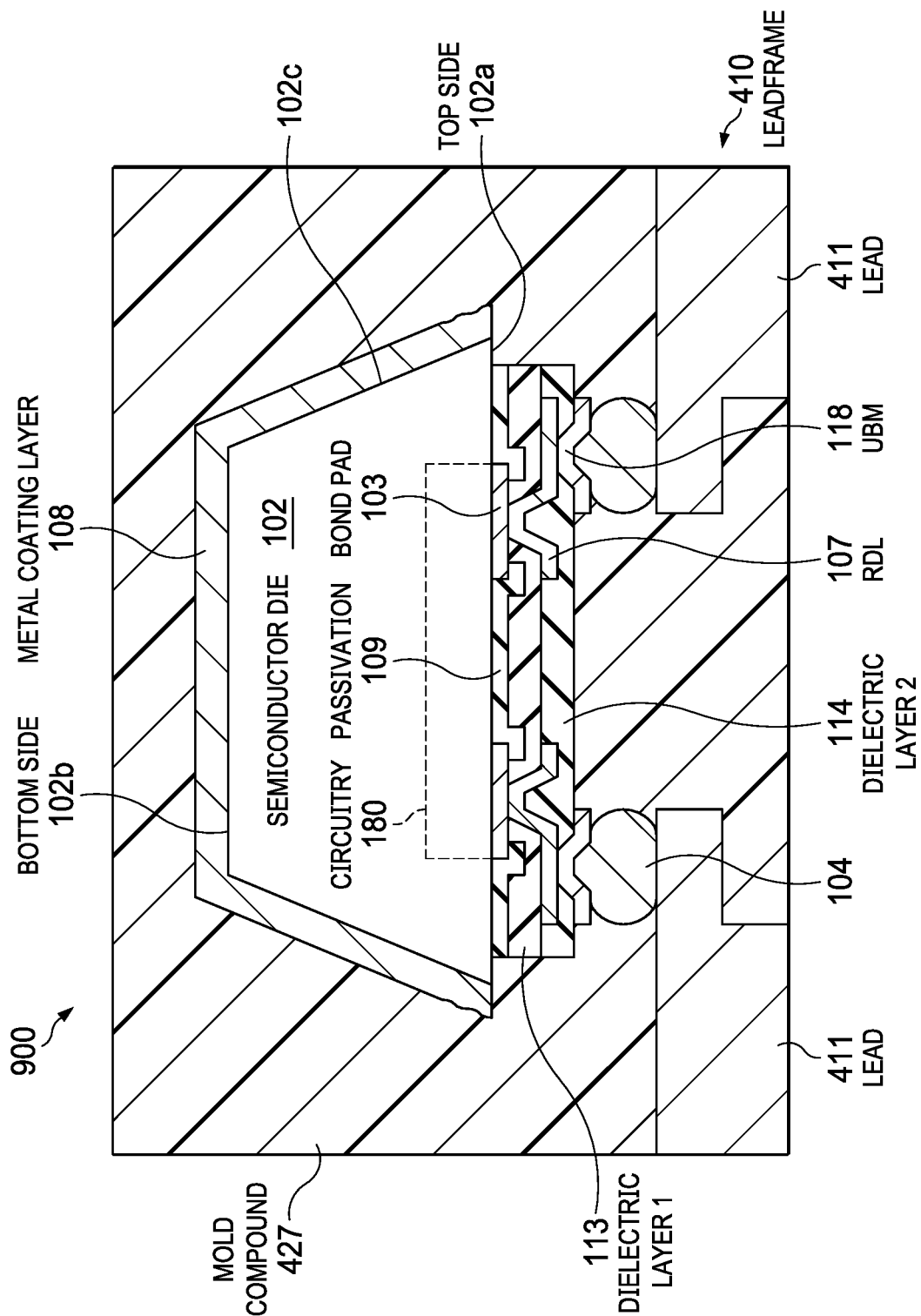
FIG. 9 is a cross-sectional view of a flipchip package mounted on a leadframe including a disclosed CSP having tapered sidewalls and a metal coating layer on the sidewall surfaces, including an encapsulating mold compound, according to an example.

FIG. 9 is a cross-sectional view of a flipchip package 900 mounted onto a leadframe 410 comprising leads shown as 411 including a disclosed CSP comprising a semiconductor die 102 having tapered sidewall surfaces 102c and a metal coating layer 108 on the sidewall surfaces 102c, including a mold compound 427. The flipchip package 900 is shown as a leadless package, such as a QFN package, where there are solder balls 104 on the leads 411.

Figure 10A:
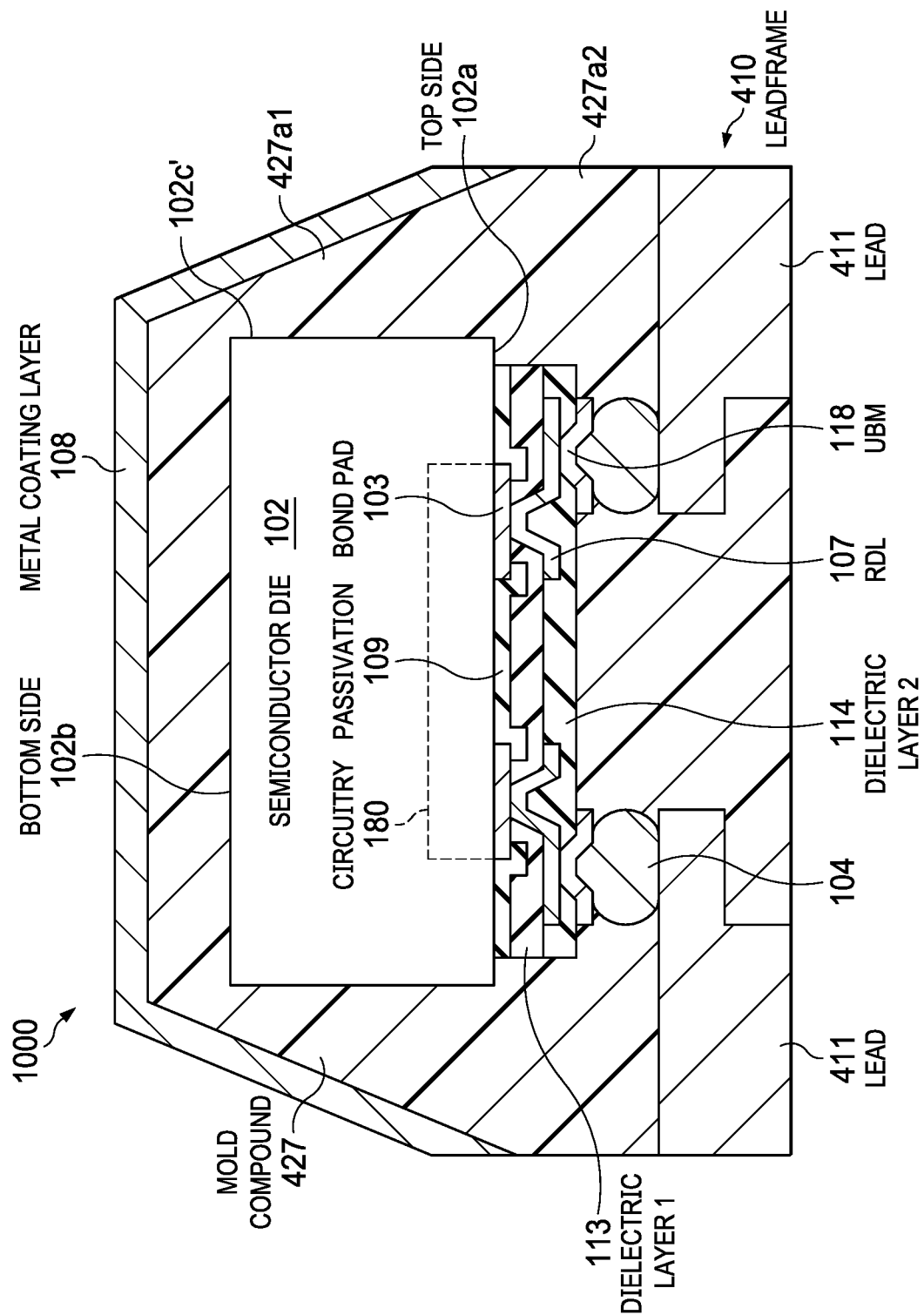
FIG. 10A is a cross-sectional view of a wirebond package including a CSP flipchip mounted on a leadframe, including an encapsulating mold compound that provides the taper, and a metal coating layer that is tapered by being formed over the tapered mold compound including on top of the sidewall surfaces and on the bottom side surface, according to an example.

In other disclosed aspects, including as disclosed above relative to FIGS. 4A-D, 5A-E, and 6A-E, it is a mold compound 427 that has tapered sidewalls, rather than the sidewall surfaces of the semiconductor die 102. FIG. 10A is a cross-sectional view of a flipchip package 1000 including a CSP comprising a semiconductor die 102, where the tapered sidewalls enabling the metal coating layer 108 for the package 1000 to be tapered is now provided by a mold compound 427 that includes a tapered sidewall portion 427a1 and a straight sidewall portion 427a2. The semiconductor die 102 is flipchip mounted onto a leadframe 410 having leads 411 with the solder balls 104 on the leads 411. A disclosed metal coating layer 108 that has tapered sidewalls is tapered by being over the tapered sidewall portion 427a1 that takes on its taper. The sidewall surfaces of the semiconductor die 102 which are non-tapered are now shown as 102c', wherein the metal coating layer 108 is again also on the bottom side surface 102b.

Figure 10B:
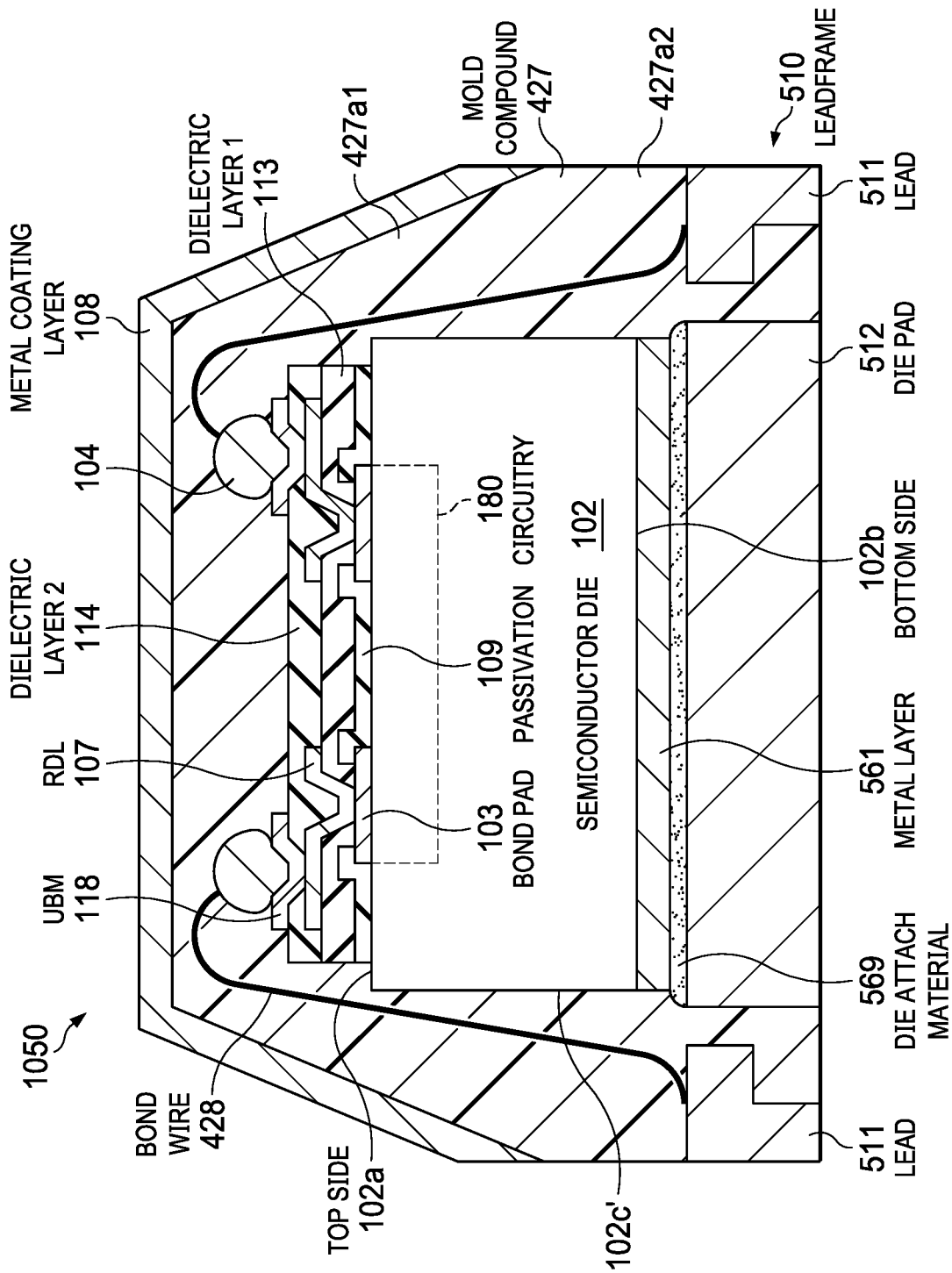
FIG. 10B is a cross-sectional view of a wirebond package including a CSP mounted on a die pad of a leadframe including an encapsulating mold compound that provides the taper, and a metal coating layer that is tapered by being over the mold compound which is over the sidewall surfaces and the bottom side surface, according to an example.

FIG. 10B is a cross-sectional view of a wirebond package 1050 including a disclosed CSP comprising a semiconductor die 102 having a mold compound 427 thereon that is again tapered in part to provide a tapered sidewall portion 427a1, with the semiconductor die 102 mounted on a die pad 512 by a die attach material 569. A metal coating layer 108 is over the mold compound 427 including over the tapered sidewall portion 427a1 to provide a taper over the sidewall surfaces 102c' and the bottom side surface 102b of the semiconductor die 102.

Disclosed aspects can be integrated into a variety of assembly flows to form a variety of different unpackaged semiconductor die and also semiconductor packages including leadframes are packaged substrates, and related products. The unpackaged semiconductor die or semiconductor package can comprise single semiconductor die or multiple semiconductor die, such as configurations comprising a plurality of stacked semiconductor die, or laterally positioned semiconductor die. A variety of package substrates may be used. The semiconductor die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of forming a semiconductor package, the method comprising:

cutting through a semiconductor assembly that includes a plurality of semiconductor die each including a top side surface comprising a semiconductor material including circuitry therein having bond pads connected to nodes in the circuitry and a bottom side surface, the cutting forming sidewall surfaces defining a sidewall plane that is at an angle from 10° to 60° relative to the bottom side surface, and forming a metal coating layer including a bottom side metal layer over an entire area of the bottom side surface extending continuously to a sidewall metal layer over the sidewall surfaces, and without extending into the top side surface, wherein the sidewall metal layer includes the sidewall plane having the angle from 10° to 60°, and wherein the cutting comprises a first cutting step and a second cutting step, the first cutting step utilizing a tapered blade to cut to a middle of the semiconductor assembly, then utilizing a straight shape blade to complete the cutting.

2. The method of claim 1, wherein the semiconductor assembly comprises a wafer, and the method further comprises:

mounting the wafer which has scribe lines between the semiconductor die so that the top side surface of the semiconductor die faces down on an affixing system configured for securing the wafer;

wherein the cutting comprises cutting through the scribe lines starting from the bottom side surface to form the cut sidewall surface that are between the top side surface and the bottom side surface, and separating the metal coating layer in locations between adjacent ones of the semiconductor die to form a plurality of singulated ones of the semiconductor die.

3. The method of claim 2, wherein the separating comprises die picking comprising removing individual ones of the semiconductor assembly from the affixing system.

4. The method of claim 2, wherein the affixing system comprises a dicing tape.

5. The method of claim 1, wherein the semiconductor assembly comprises the plurality of semiconductor die each mounted on a leadframe of a leadframe panel having leads with the bond pads electrically connected to the leads or the leads, further comprising forming a mold compound to encapsulate the plurality of semiconductor die, and wherein the cutting comprises cutting the mold compound to provide the cut sidewall surfaces defining the sidewall plane having the angle of at least 10° relative to the bottom side surface.

6. The method of claim 1, wherein a blade having a tapered distal end is used for the cutting.

7. The method of claim 1, wherein the forming the metal coating layer comprises a sputter deposition process or a spray process.

8. The method of claim 1, wherein the cutting comprises utilizing a tapered blade having a pointed end, wherein the cutting provides cuts through an entire thickness of the semiconductor assembly.

9. The method of claim 1, wherein the metal coating layer comprises at least one of aluminum, copper, gold, titanium, nickel, silver, palladium, and tin.

10. The method of claim 1, wherein the metal coating layer has an average thickness of 1 nm to 5 µm.

11. The method of claim 1, wherein the metal coating layer covers an entire area of all of the sidewall surfaces, and entire area of the bottom side surface.

12. The method of claim 1, wherein the sidewall surfaces are 4 in number, and an interface with the bottom side surface are each linear surfaces that are at an angle of 25° to 60° relative to a normal projection drawn down from the top side surface.

13. The method of claim 1, wherein the method further comprises before forming the metal coating layer forming a dielectric layer on the bottom side surface and on the sidewall surfaces.

14. The method of claim 1, further comprising forming a mold compound around the plurality of semiconductor die.

15. The method of claim 14, wherein the forming the mold compound takes place after the forming of the metal coating layer.

16. The method of claim 14, wherein the forming the mold compound takes place before the forming of the metal coating layer so that the metal coating layer is on the mold compound.

17. The method of claim 14, further comprising mounting the semiconductor die on a leadframe having leads, and electrically connecting the bond pads to the leads before the forming of the mold compound.

* * * * *